（12）United States Patent
Shiono et al.

(10) Patent No.: US 7,851,129 B2
(45) Date of Patent: *Dec. 14, 2010

(54) RESIST COMPOSITION, RESIST PATTERN FORMING METHOD AND COMPOUND

(75) Inventors: Daiju Shiono, Kawasaki (JP); Taku Hirayama, Kawasaki (JP); Toshiyuki Ogata, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 391 days.

This patent is subject to a terminal disclaimer.

(21) Appl. No.: 11/718,091

(22) PCT Filed: Sep. 30, 2005

(86) PCT No.: PCT/JP2005/018143

§ 371 (c)(1),
(2), (4) Date: Apr. 26, 2007

(87) PCT Pub. No.: WO2006/046383

PCT Pub. Date: May 4, 2006

(65) Prior Publication Data

US 2009/0162781 A1    Jun. 25, 2009

(30) Foreign Application Priority Data

Oct. 29, 2004   (JP) .............................. 2004-315601
Dec. 27, 2004   (JP) .............................. 2004-378248
Feb. 25, 2005   (JP) .............................. 2005-050722
Jul. 22, 2005   (JP) .............................. 2005-212904

(51) Int. Cl.
    G03F 7/00    (2006.01)
    G03F 7/004   (2006.01)
(52) U.S. Cl. ..................... 430/270.1; 430/905; 430/913
(58) Field of Classification Search .............. 430/270.1, 430/905, 913
    See application file for complete search history.

(56) References Cited

U.S. PATENT DOCUMENTS

| | | | |
|---|---|---|---|
| 5,658,706 A | 8/1997 | Niki et al. | |
| 5,693,452 A | 12/1997 | Aoai et al. | |
| 5,707,776 A | 1/1998 | Kawabe et al. | |
| 5,824,451 A * | 10/1998 | Aoai et al. ................ | 430/270.1 |
| 5,837,420 A * | 11/1998 | Aoai et al. ................ | 430/270.1 |
| 5,844,057 A | 12/1998 | Watanabe et al. | |
| 5,994,025 A | 11/1999 | Iwasa et al. | |
| 6,037,098 A | 3/2000 | Aoai et al. | |
| 6,106,993 A | 8/2000 | Watanabe et al. | |
| 6,197,473 B1 | 3/2001 | Kihara et al. | |
| 6,638,683 B1 | 10/2003 | Tan et al. | |
| 7,220,808 B2 | 5/2007 | Yamagishi et al. | |
| 7,504,196 B2 * | 3/2009 | Shiono et al. ............. | 430/270.1 |
| 2002/0025495 A1 | 2/2002 | Ogata et al. | |
| 2002/0058205 A1 | 5/2002 | Nakashima et al. | |
| 2003/0232277 A1 | 12/2003 | Sasaki et al. | |
| 2004/0005512 A1 | 1/2004 | Mizutani et al. | |
| 2004/0234885 A1 | 11/2004 | Watanabe et al. | |
| 2005/0271971 A1 | 12/2005 | Ueda et al. | |
| 2007/0259273 A1 | 11/2007 | Shiono et al. | |
| 2007/0281243 A1 | 12/2007 | Hirayama | |
| 2008/0020288 A1 | 1/2008 | Hirayama et al. | |
| 2008/0145784 A1 | 6/2008 | Shiono et al. | |
| 2009/0162781 A1 | 6/2009 | Shiono et al. | |

FOREIGN PATENT DOCUMENTS

| | | |
|---|---|---|
| JP | H05-061197 | 3/1993 |
| JP | H05-249681 | 9/1993 |
| JP | H06-059444 | 3/1994 |
| JP | H06-167811 | 6/1994 |
| JP | 6-266109 A | 9/1994 |
| JP | 06266109 A * | 9/1994 |
| JP | 08-193054 | 7/1996 |
| JP | H08-220740 | 8/1996 |
| JP | H08-262712 | 10/1996 |
| JP | H08-337616 | 12/1996 |
| JP | H09-005999 | 1/1997 |

(Continued)

OTHER PUBLICATIONS

Machine translation of JP 06-266109 (no date).*

(Continued)

*Primary Examiner*—Amanda C. Walke
(74) *Attorney, Agent, or Firm*—Knobbe, Martens, Olson & Bear, LLP

(57) ABSTRACT

This resist composition is a resist composition containing a compound in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the following general formulas (p1) and (p2) wherein $R_1$ and $R_2$ each independently represents a branched or cyclic alkyl group, and may contain a hetero atom in the structure; $R_3$ represents a hydrogen atom or a lower alkyl group; and n' represents an integer of 1 to 3.

[Chemical Formula 1]

$$\{CH_2\}_{n'}\!\!-\!\!\underset{\underset{O}{\|}}{C}\!\!-\!\!O\!\!-\!\!R_1 \quad (p1)$$

$$\underset{\underset{R_3}{|}}{\overset{\overset{H}{|}}{C}}\!\!-\!\!O\!\!-\!\!R_2 \quad (p2)$$

5 Claims, No Drawings

FOREIGN PATENT DOCUMENTS

| JP | H09-160246 | 6/1997 |
| JP | A-09-211866 | 8/1997 |
| JP | H10-123703 A | 5/1998 |
| JP | H10-274845 | 10/1998 |
| JP | 11-167199 A | 6/1999 |
| JP | H11-153863 | 6/1999 |
| JP | H11-199533 | 7/1999 |
| JP | 2000-086584 | 3/2000 |
| JP | 2000-305270 | 11/2000 |
| JP | 2000-330282 | 11/2000 |
| JP | 2001-312055 | 11/2001 |
| JP | 2002-99088 A | 4/2002 |
| JP | 2002-099089 | 4/2002 |
| JP | 2002-221787 A | 8/2002 |
| JP | 2002-328473 | 11/2002 |
| JP | 2003-084437 | 3/2003 |
| JP | 2003-183227 | 7/2003 |
| JP | 2003-260881 | 9/2003 |
| JP | 2004-062049 | 2/2004 |
| JP | 2004-125835 | 4/2004 |
| JP | 2004-151605 | 5/2004 |
| JP | 2004-191913 | 7/2004 |
| JP | 2004-302440 | 10/2004 |
| JP | 2004-359590 | 12/2004 |
| JP | 2002-055452 | 2/2005 |
| JP | 2005-089387 | 4/2005 |
| JP | 2005-091909 | 4/2005 |
| JP | 2005-309421 | 11/2005 |
| KR | 0231242 | 5/1997 |
| KR | 2001-0088341 | 9/2001 |
| KR | 10-0406242 | 11/2003 |
| TW | 200302397 A | 8/2003 |
| TW | 200617602 | 6/2006 |
| WO | WO 2006/046383 | 5/2006 |

OTHER PUBLICATIONS

Office Action issued Sep. 16, 2008 on the counterpart Korean Patent Application No. 10-2007-7010473.
International Search Report from PCT/JP2005/018143 dated Nov. 15, 2005.
Hirayama et al, "Development of Amorphous PolyPhenol Resists with Low Molecular Weight and Narrow Dispersion for EB Lithography", IEEE Xplore, Oct. 22, 2004, pp. 10-11.
Hirayama et al. "Development of Electron Beam Resists Based on Amorphous Polyphenols with Low Molecular Weight and Narrow Dispersion" Proceedings of SPIE vol. 5753, p. 738-745 (2005).
Hirayama et al., Journal of Photopolymer Science and Technology, vol. 17, No. 3, 435-440, (2004).
Notice of Allowance issued on corresponding Japanese Patent Application No. 2004-260764, dated Feb. 16, 2010.
Office Action issued in corresponding U.S. Appl. No. 10/590,046, dated Mar. 17, 2010.
Office Action issued in corresponding U.S. Appl. No. 10/590,046, dated Sep. 21, 2009.
Office Action issued in corresponding U.S. Appl. No. 10/590,046, dated Apr. 24, 2009.
Office Action issued in corresponding U.S. Appl. No. 10/590,046, dated Sep. 26, 2008.
Office Action issued in corresponding U.S. Appl. No. 11/572,630, dated Mar. 1, 2010.
Office Action issued in corresponding U.S. Appl. No. 11/572,630, dated Aug. 13, 2009.
Office Action issued in corresponding U.S. Appl. No. 11/572,630, dated Apr. 23, 2009.
Office Action issued in corresponding U.S. Appl. No. 11/572,630, dated Sep. 25, 2008.
Office Action issued in corresponding U.S. Appl. No. 11/574,805 dated Feb. 26, 2010.
Office Action issued in corresponding U.S. Appl. No. 11/574,805 dated Aug. 4, 2009.
Office Action issued in corresponding U.S. Appl. No. 11/574,805 dated May 19, 2009.
Office Action issued in corresponding U.S. Appl. No. 11/574,805 dated Aug. 19, 2008.
Office Action issued in corresponding U.S. Appl. No. 11/574,805 dated Feb. 10, 2009.
Office Action issued in corresponding U.S. Appl. No. 11/813,511, dated Apr. 28, 2010.
Office Action issued in corresponding U.S. Appl. No. 11/813,511, dated Oct. 8, 2009.
Office Action issued in corresponding U.S. Appl. No. 11/884,748, dated Jul. 7, 2008.
Office Action issued in corresponding U.S. Appl. No. 11/914,451 dated May 3, 2010.
Office Action issued in corresponding U.S. Appl. No. 11/914,451 dated Oct. 8, 2009.
Office Action issued in corresponding U.S. Appl. No. 11/917,458, dated Apr. 5, 2010.
Office Action issued in corresponding U.S. Appl. No. 11/994,602, dated Mar. 8, 2010.
International Search Report issued in corresponding PCT application no. PCT/JP2006/302271, mailed on Mar. 7, 2006.
International Search Report issued in corresponding PCT application No. PCT/JP2006/313103, dated Sep. 26, 2006.
International Search Report issued in corresponding PCT Application No. PCT/JP2006/311443, dated Jun. 7, 2006.
International Search Report issued in corresponding PCT application No. PCT/JP2006/301679, Feb. 16, 2006.
International Search Report issued in corresponding PCT application No. PCT/JP2005/013564, mailed Sep. 6, 2005.
Office Action issued on counterpart Japanese Patent Application No. 2004-182300, dated May 27, 2008.
Office Action issued on the counterpart Japanese Patent Application No. 2004-182301, dated Aug. 26, 2008.
Office Action issued on the counterpart Japanese Patent Application No. 2004-182301, dated Jun. 3, 2008.
Office Action issued on the counterpart Korean Patent Application No. 10-2007-7019433, dated Jun. 5, 2008.
Office Action issued in counterpart Japanese Patent Application No. 2005-026266, dated Mar. 3, 2009.
Office Action issued in counterpart Korean Patent Application No. 10-2007-7017441, dated May 7, 2009.
Office Action issued on Apr. 14, 2008 on the counterpart Korean Patent Application No. 10-2007-7004390.
Office Action and Search Report issued on May 12, 2008, on the counterpart Taiwanese Patent Application No. 094104523.
Yamaguchi et al., *Linewidth fluctuations caused by polymer aggregates in resist films*, Journal of Photopolymer Science and Technology, vol. 10, No. 4, pp. 635-640, (1997).
Office Action issued in counterpart Japanese Patent Application No. JP 2005-050721, dated Jul. 28, 2009.
Office Action issued in counterpart Japanese Patent Application No. JP 2004-260764, dated Mar. 3, 2009.
Office Action issued in counterpart Japanese Patent Application No. JP 2005-050721, dated Mar. 3, 2009.
Office Action issued in Korean Patent Application No. 10-2007-7004390, dated Dec. 17, 2008.
Office Action issued in Korean Patent Application No. 10-2008-7025851, dated Jan. 7, 2009.
Decision to Grant a Patent issued on Jan. 6, 2009 in Japanese Patent Application No. 2004-182301.
Hirayama, T., et al. "Depth Profile and Line-Edge Roughness of Low-Molecular-Weight Amorphous Electron Beam Resists", The Japan Journal of Applied Physics, vol. 44, No. 7B, 2005, pp. 5484-5488 (published on Jul. 26, 2005).
Notice of Allowance issued on related Korean Patent Application No. 10-2009-7006750, dated Feb. 16, 2010.
Office Action issued on the counterpart Korean Patent Application No. 10-2007-7019433, dated Jun. 5, 2008.
Office Action issued in corresponding U.S. Appl. No. 11/718,091 dated Sep. 14, 2009.
Office Action issued in corresponding U.S. Appl. No. 11/574,805 dated Feb. 10, 2009.

Office Action issued in corresponding U.S. Appl. No. 11/994,602, dated Mar. 8, 2010.

Office Action/Notice of Allowance issued in counterpart Japanese Patent Application No. 2004260764, dated Feb. 16, 2010.

Office Action issued in related U.S. Appl. No. 11/572,630, dated Jul. 12, 2010.

Office Action issued in related U.S. Appl. No. 10/590,046, dated Jul. 20, 2010.

Office Action issued in related U.S. Appl. No. 11/574,805 dated Jul. 1, 2010.

European Search Report issued on counterpart European Patent Application No. EP 05788289.6, dated Jul. 26, 2010.

Office Action issued in related U.S. Appl. No. 11/994,602, dated Aug. 19, 2010.

Notice of Allowance issued in related U.S. Appl. No. 11/917,458, dated Sep. 7, 2010.

European Search Report issued in related European Patent Application No. EP 06732357.6, dated Aug. 30, 2010.

Final Office Action issued in related U.S. Appl. No. 11/813,511, dated Oct. 6, 2010.

* cited by examiner

RESIST COMPOSITION, RESIST PATTERN FORMING METHOD AND COMPOUND

RELATED APPLICATIONS

This application is the U.S. National Phase filing under 35 U.S.C. §371 of PCT/JP2005/018143, filed Sep. 30, 2005, which designated the United States and was published in a language other than English, which claims priority under 35 U.S.C. §119(a)-(d) to Japanese Patent Application No. 2004-315601, filed Oct. 29, 2004; Japanese Patent Application No. 2004-378248, filed Dec. 27, 2004; Japanese Patent Application No. 2005-050722, filed Feb. 25, 2005; and Japanese Patent Application No. 2005-212904, filed Jul. 22, 2005. The content of these applications is incorporated herein by reference in their entireties.

TECHNICAL FIELD

The present invention relates to a resist composition, a resist pattern forming method using the resist composition, and a compound suited for a resist composition.

BACKGROUND ART

In the production of semiconductor devices and liquid crystal displays, rapid progress has recently been made in miniaturizing of a pattern with the progress of a lithography technology. As a technique for miniaturizing of the size, shortening of the wavelength of an exposure light source is generally performed. Specifically, while ultraviolet rays typified by g-ray and i-ray have hitherto been used, mass production of semiconductor devices using a KrF excimer laser or an ArF excimer laser has recently started. Also, a study on $F_2$ excimer laser having a shorter wavelength than that of these excimer lasers, electron beam, EUV (extreme ultra violet), and X-rays have been made.

As one of pattern forming materials capable of forming a pattern having a fine size, a chemically amplified resist containing a base resin component having a film forming ability and an acid generator component which generates an acid upon exposure is known. The chemically amplified resist includes, for example, a negative chemically amplified resist in which alkali solubility decreases upon exposure, and a positive chemically amplified resist in which alkali solubility enhances upon exposure.

A polymer is conventionally used as a base material component of the chemically amplified photoresist and, for example, polyhydroxystyrene (PHS), a PHS-based resin in which a portion of hydroxyl groups is protected with an acid dissociable dissolution inhibiting group, and a copolymer derived from a (meth)acrylate ester are used.

However, in the case of forming a pattern using such a pattern forming material, these arises a problem such as roughness on the top face of the pattern or the surface of the side wall. Such a problem becomes more serious as the pattern size decreases. For example, it is an object to form a fine pattern of several tens of nanometers in lithography using EUV or EB, and therefore there is required ultra-low roughness which exceeds conventional pattern roughness.

However, a polymer used commonly as a base material has so large molecular size (mean square radius per molecule) as several nanometers. In the developing step of pattern formation, since dissolution behavior of the resist to a developing solution is commonly conducted at a molecular unit of a base material component, it is very difficult to further reduce roughness as long as the polymer is used as the base material component.

To solve such a problem, a resist using a low molecular material as a base material component is proposed as a material which is developed so as to attain ultra-low roughness. For example, Japanese Unexamined Patent Application, First Publication No. 2002-099088 and Japanese Unexamined Patent Application, First Publication No. 2002-099089 proposes a low molecular material having an alkali soluble group such as hydroxyl group, a portion or all of which is protected with an acid dissociable dissolution inhibiting group. It is anticipated that such a low molecular material has a low molecular weight and therefore has a small molecular size and can reduce roughness.

However, it is actually difficult to form a fine pattern, for example, a fine pattern having a size of 90 nm or less in a level, which enables practical use, using such a material. For example, there is a problem that a pattern itself cannot be formed or, if the pattern is formed, the patter has very poor shape.

DISCLOSURE OF THE INVENTION

Under these circumstances, the present invention has been made and an object thereof is to provide a resist composition capable of forming a resist pattern having excellent resolution and shape, a resist pattern forming method using the resist composition, and a compound suited for the resist composition.

The present inventors have intensively studied and found that the above object is achieved by protecting a phenolic hydroxyl group of a polyhydric phenol compound having a specific low molecular weight with a specific acid dissociable dissolution inhibiting group, and thus the present invention has been completed.

That is, a first aspect of the present invention is a resist composition comprising a base material component (A) having an acid dissociable dissolution inhibiting group in which alkali solubility enhances under an action of an acid, and an acid generator component (B) which generates an acid upon exposure, wherein the base material component (A) contains a compound (A1) in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the following general formulas (p1) and (p2):

[Chemical Formula 1]

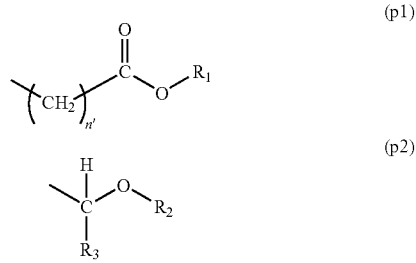

wherein $R_1$ and $R_2$ each independently represents a branched or cyclic alkyl group, and may contain a hetero atom in the structure; $R_3$ represents a hydrogen atom or a lower alkyl group;

Also, a second aspect of the present invention is a resist pattern forming method, which comprises the steps of forming a resist film on a substrate using the resist composition of the first aspect, exposing the resist film, and developing the resist film to form a resist pattern.

Also, a third aspect of the present invention is a compound in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the following general formulas (p1) and (p2):

[Chemical Formula 2]

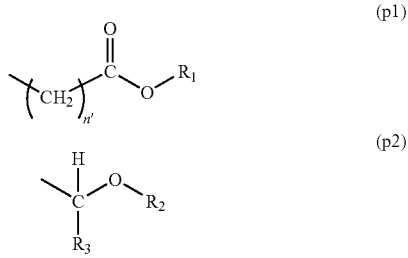

wherein $R_1$ and $R_2$ each independently represents a branched or cyclic alkyl group, and may contain a hetero atom in the structure; $R_3$ represents a hydrogen atom or a lower alkyl group; and n' represents an integer of 1 to 3.

In the present invention, "exposure" has a concept including entire irradiation with radiation.

According to the present invention, a resist composition capable of forming a resist pattern having excellent resolution and shape, a resist pattern forming method using the resist composition, and a compound suited for the resist composition are provided.

BEST MODE FOR CARRYING OUT THE INVENTION

Compound

The compound of the present invention (hereinafter referred to as a compound (A1)) is a compound in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the above general formulas (p1) and (p2).

In the formula (p1), $R_1$ is a branched or cyclic alkyl group and the alkyl group may contain a hetero atom such as oxygen atom, nitrogen atom, or sulfur atom in the structure. That is, $R_1$ includes, for example, a branched or cyclic alkyl group in which a portion or all of hydrogen atoms may be substituted with a group containing a hetero atom (also including the case of the hetero atom itself), or a group in which a portion of carbon atom of the alkyl group are substituted with a hetero atom. Examples of the hetero atom include oxygen atom, sulfur atom, nitrogen atom, and fluorine atom. In the present invention, "alkyl group" means a monovalent saturated hydrocarbon group unless otherwise specified.

"Group containing a hetero atom" may be a hetero atom itself or a group composed of a hetero atom, a carbon atom and/or hydrogen atom, for example, an alkoxy group.

Examples of the alkyl group in which a portion or all of hydrogen atoms are substituted with a hetero atom include a fluorinated lower alkyl group in which a portion or all of hydrogen atoms are substituted with a fluorine atom, a group in which two hydrogen atoms bonded to the same carbon atom are substituted with one oxygen atom (that is, a group having a carbonyl group (C=O)), and a group in which two hydrogen atoms bonded to the same carbon atom are substituted with one sulfur atom (that is, a group having thiocarbonyl (C=S)).

Examples of "group in which a portion of carbon atoms of an alkyl group are substituted with a hetero atom" include an example in which carbon atoms are substituted with a nitrogen atom (for example, a branched or cyclic alkyl group having —$CH_2$— in the structure in which —$CH_2$— is substituted with —NH—), and an example in which carbon atoms are substituted with an oxygen atom (for example, a branched or cyclic alkyl group having —$CH_2$— in the structure in which —$CH_2$— is substituted with —O—.

n' is 1 or 2, and is preferably 1.

The branched alkyl group of $R_1$ preferably has 4 to 10 carbon atoms, and more preferably 4 to 8 carbon atoms. Specific examples thereof include isobutyl group, tert-butyl group, isopentyl group, neopentyl group, and tert-pentyl group.

The cyclic alkyl group of $R_1$ preferably has 3 to 20 carbon atoms, more preferably 4 to 14 carbon atoms, and most preferably 5 to 12 carbon atoms.

The basic ring (basic ring excluding a substituent) of a cyclic alkyl group may have a monocyclic or polycyclic structure, and particularly preferably a polycyclic structure because of excellent effects of the present invention. Also, the basic ring may be a hydrocarbon ring composed of carbon and hydrogen, and a portion of carbon atoms constituting the hydrocarbon ring may be a heterocycle substituted with a hetero atom. In the present invention, the basic ring is particularly preferably a hydrocarbon ring. Examples of the hydrocarbon ring include monocycloalkane, bicycloalkane, tricycloalkane, and tetracycloalkane. Specific examples thereof include monocycloalkane such as cyclopentane or cyclohexane; and polycycloalkane such as adamantane, norbornane, isobornane, tricyclodecane, or tetracyclododecane. Among these hydrocarbon rings, adamantane, norbornane, tricyclodecane, and tetracyclododecane are preferable and adamantane is particularly preferable.

These basic rings may have a substituent on the ring or not. Examples of the substituent include lower alkyl group, fluorine atom, fluorinated lower alkyl group, and =O. The lower alkyl group includes, for example, a linear or branched alkyl group having 1 to 5 carbon atoms such as methyl group or ethyl group. When the basic ring has a substituent, the number of the substituent is preferably from 1 to 3, and more preferably 1. As used herein, the phrase "having a substituent" means that hydrogen atoms bonded to carbon atoms constituting the basic ring are substituted with a substituent.

The cyclic alkyl group of $R_1$ includes, for example, a group in which one hydrogen atom is eliminated from these basic rings. In $R_1$, the carbon atom, to which the oxygen atom adjacent to $R_1$ is bonded, is preferably one of carbon atoms constituting the above basic ring, and the carbon atom, to which the oxygen atom adjacent to $R_1$ is bonded, is particularly preferably a tertiary carbon atom, to which a substituent such as lower alkyl group is bonded, because of excellent effects of the present invention. Examples of the group represented by the formula (p1) having a cyclic alkyl group as $R_1$ include groups represented by the following formulas:

[Chemical Formula 3]

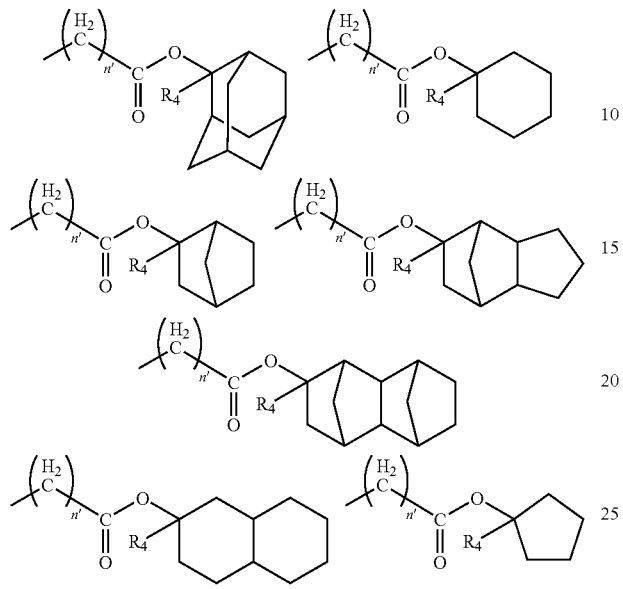

wherein $R_4$ represents a lower alkyl group, and n' is as defined above.

Among these groups, a preferable group is a group represented by the following general formula:

[Chemical Formula 4]

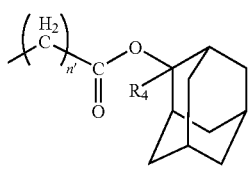

wherein $R_4$ represents a lower alkyl group, and n' is as defined above.

The lower alkyl group of $R_4$ is an alkyl group having 1 to 5 carbon atoms and specific examples thereof include lower linear or branched alkyl groups such as methyl group, ethyl group, propyl group, isopropyl group, n-butyl group, isobutyl group, tert-butyl group, pentyl group, isopentyl group, and neopentyl group. $R_4$ is preferably a methyl group or an ethyl group because it is easily available from an industrial point of view, and a methyl group is more preferable.

In the formula (p2), $R_2$ includes the same groups as those of $R_1$.

$R_3$ is a hydrogen atom or lower alkyl group. The lower alkyl group of $R_3$ is an alkyl group having 1 to 5 carbon atoms and specific examples thereof include linear or branched alkyl groups such as methyl group, ethyl group, propyl group, isopropyl group, n-butyl group, isobutyl group, tert-butyl group, pentyl group, isopentyl group, and neopentyl group. $R_3$ is preferably a hydrogen atom or a methyl group because it is easily available from an industrial point of view, and is more preferably a hydrogen atom.

Examples of the group represented by the formula (p2) include those represented by the following chemical formulas:

[Chemical Formula 5]

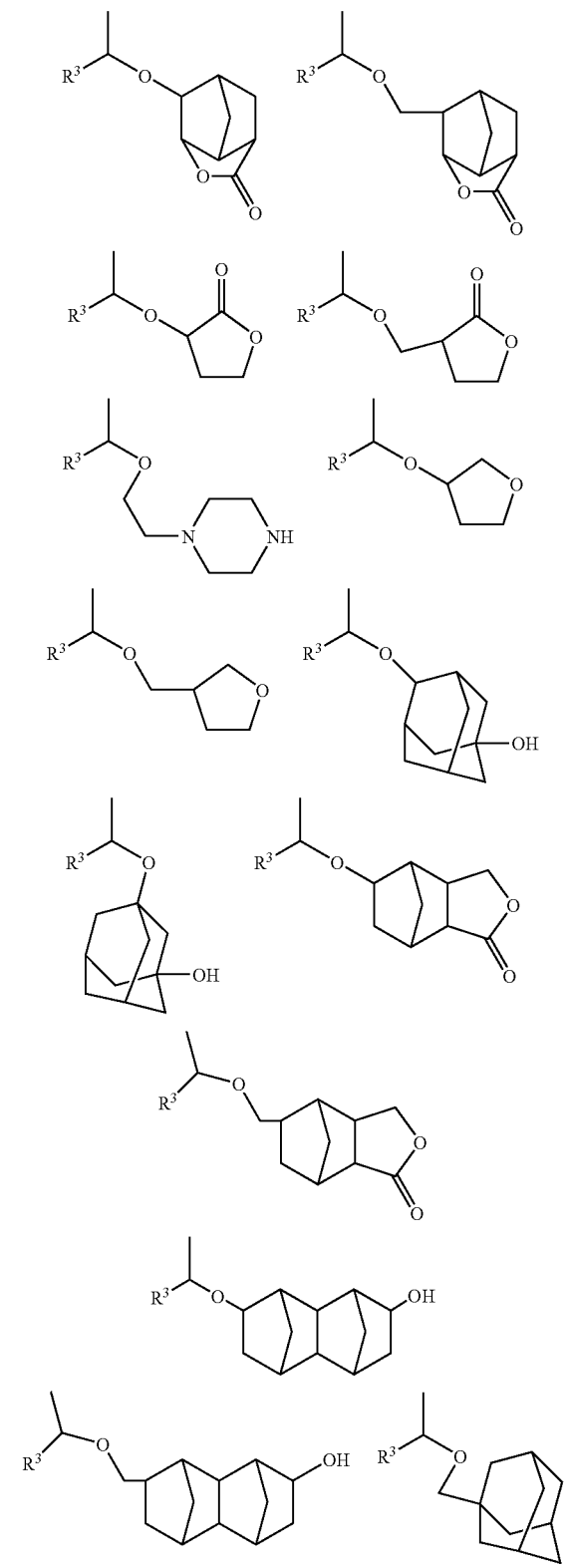

-continued

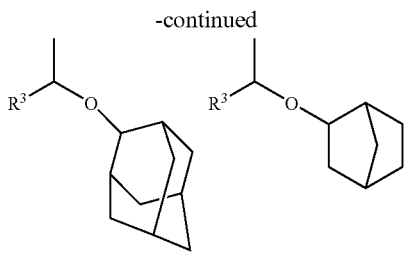

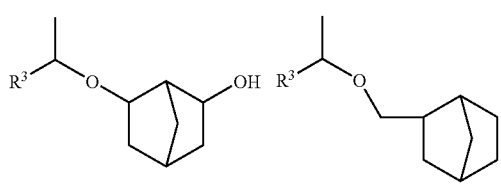

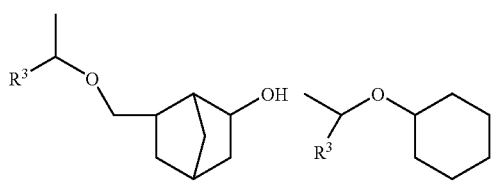

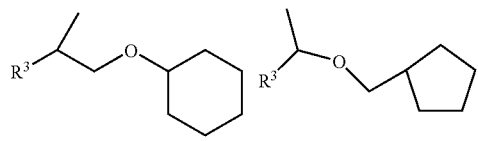

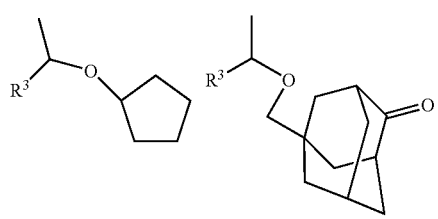

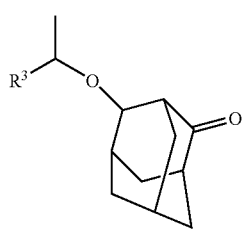

wherein $R^3$ is as defined above.

Among these, a compound is preferably a compound represented by the following general formula:

[Chemical Formula 6]

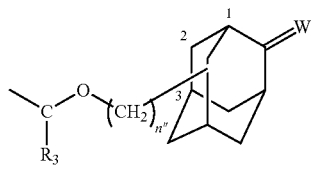

$R^3$ is as defined above, n" represents 0 or an integer of 1 to 2, and W represents a diatomic hydrogen atom or oxygen atom.

n" is most preferably 0 or 1. The bonding site of an adamantyl group and —C($R^3$)—O—($CH_2$)$_{n"}$— is not specifically limited, but it is preferable to bond at the 1- or 2-position of the adamantyl group.

The polyhydric phenol compound (a) (in the state where hydrogen atoms of a phenolic hydroxyl group are not substituted with at least one selected from the group consisting of groups represented by the above general formulas (p1) and (p2)) which constitutes the compound (A1) is not specifically limited as long as it is a polyhydric phenol compound having two or more phenolic hydroxyl groups and having the molecular weight of 300 to 2,500 and, for example, it is possible to use a polyhydric phenol compound which is known as a sensitizer or a heat resistance improver in a non-chemically amplified g-ray or i-ray resist. Examples of the polyhydric phenol compound include tetranuclear components of a formalin condensate of phenols such as bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, 1-[1-(4-hydroxyphenyl)isopropyl]-4-[1,1-bis(4-hydroxyphenyl) ethyl]benzene, phenol, m-cresol, p-cresol, and xylenol.

In the present invention, at least one selected from the group consisting of polyhydric phenol compounds represented by the following general formulas (I), (II), and (III) is preferable. When the compound has a benzene ring (which may have a substituent) structure having a hydroxyl group, as shown below, it is excellent in effects of the present invention. The reason is considered as follows. That is, when the compound has the structure, it has high amorphous properties, stability capable of exhibiting a function of forming a good film, and also has high solubility in an alcohol.

[Chemical Formula 7]

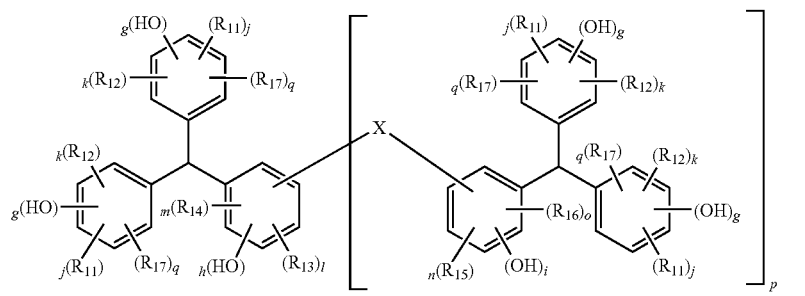

(I)

[Chemical Formula 8]

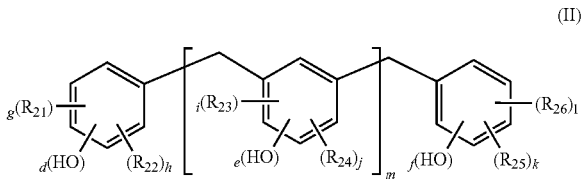

(II)

[Chemical Formula 9]

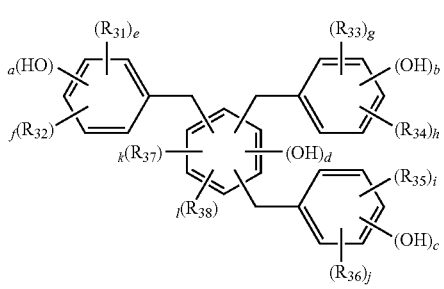

(III)

In the above general formula (I), $R_{11}$ to $R_{17}$ each independently represents a linear, branched or cyclic lower alkyl group having 1 to 10 carbon atoms, and preferably 1 to carbon atoms, a cyclic alkyl group having 5 to 6 carbon atoms, or aromatic hydrocarbon group. The alkyl group or aromatic hydrocarbon group may contain a hetero atom such as oxygen atom, nitrogen atom, or sulfur atom in the structure. Examples of the aromatic hydrocarbon group include phenyl group, tolyl group, xylyl group, mesityl group, phenethyl group, and naphthyl group.

g and j each independently represents 1 or more, and preferably an integer of 1 to 2, and k and q each independently represents 0 or 1, and preferably an integer of 2 or less, and g+j+k+q is 5 or less.

h is 1 or more, and preferably an integer of 1 to 2, l and m each independently represents 0 or 1 or more, and preferably an integer of less than 2, and h+l+m is 4 or less.

i is 1 or more, and preferably an integer of 1 to 2, n and o each independently represents 0 or 1 or more, and preferably an integer of less than 2, and i+n+o is 4 or less.

p is 0 or 1, and preferably 1.

X is a group represented by the following general formula (Ia) or (Ib):

[Chemical Formula 10]

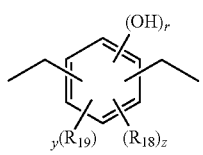

(Ia)

(Ib)

in the formula (Ia), similar to $R_{11}$ to $R_{17}$, $R_{18}$ and $R_{19}$ each independently represents an alkyl group having 1 to 10 carbon atoms or an aromatic hydrocarbon group, and may contain a hetero atom in the structure; r, y and z each independently represents an integer of 0 or 1 or more, and r+y+z is 4 or less.

It is preferably a compound in which $R_{11}$ is a cycloalkyl group, j is 1, $R_{12}$ is a lower alkyl group, k is 1, and g is 1.

It is more preferably a compound in which $R_{11}$ is a cycloalkyl group, j is 1, $R_{12}$ is a lower alkyl group, k is 1, g is 1, q, l, m, n and o represent 0, and h and i simultaneously represents 1 because a fine pattern having reduced LER (line edge roughness) and high resolution can be formed.

X is most preferably a group represented by the general formula (Ib) because it is easy to synthesize.

Among the polyhydric phenol compounds represented by the above general formula (I), polyhydric phenol compounds represented by the following formulas (I-1), (I-2), (I-3) and (I-4) are preferable.

[Chemical Formula 11]
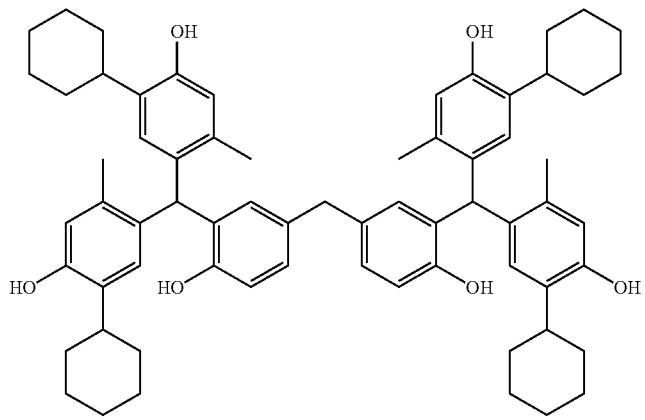
(I-1)
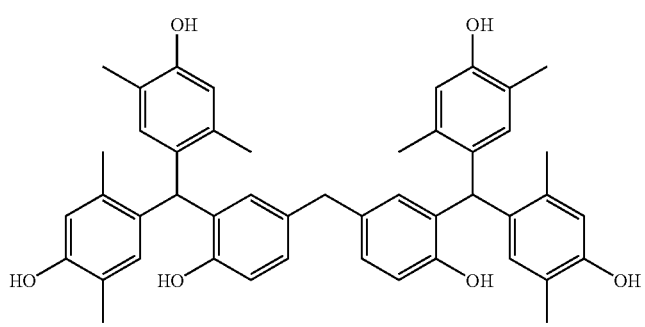
(I-2)
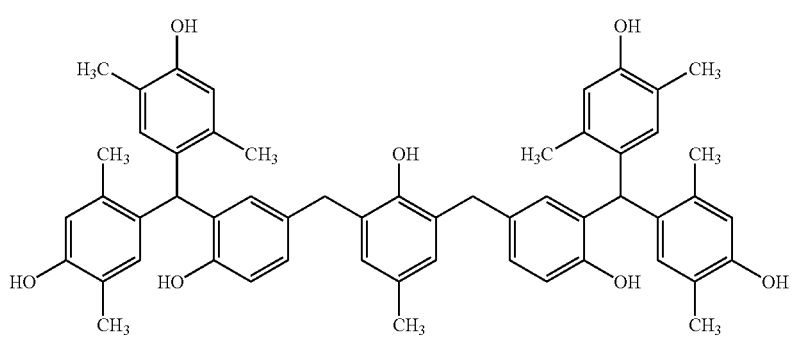
(I-3)
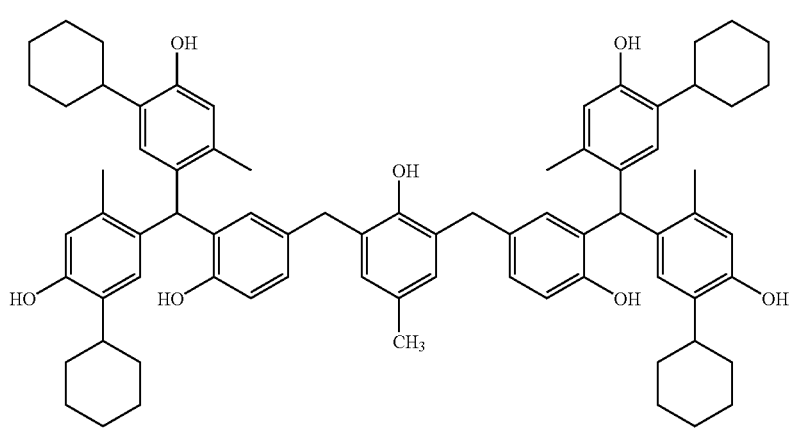
(I-4)

In the general formula (II), $R_{21}$ to $R_{26}$ each independently represents a linear, branched or cyclic lower alkyl group having 1 to 10 carbon atoms, and preferably 1 to carbon atoms, a cyclic alkyl group having 5 to 6 carbon atoms, or aromatic hydrocarbon group. The alkyl group or aromatic hydrocarbon group may contain a hetero atom such as oxygen atom, nitrogen atom, or sulfur atom in the structure. Examples of the aromatic hydrocarbon group include phenyl group, tolyl group, xylyl group, mesityl group, phenethyl group, and naphthyl group. All of $R_{21}$ to $R_{26}$ are preferably lower alkyl groups.

d and g each independently represents 1 or more, and preferably an integer of 1 to 2, h is 0 or 1 or more, and preferably an integer of less than 2, and d+g+h is 5 or less.

e and i each independently represents 1 or more, and preferably an integer of 1 to 2, j is 0 or 1 or more, and preferably an integer of less than 2, and e+i+j is 4 or less.

f and k each independently represents 1 or more, and preferably an integer of 1 to 2, l is 0 or 1 or more, and preferably an integer of less than 2, and f+k+l is 5 or less.

m is an integer of 1 to 20, and preferably 2 to 10.

In the general formula (III), $R_{31}$ to $R_{36}$ each independently represents a linear, branched or cyclic lower alkyl group having 1 to 10 carbon atoms, and preferably 1 to 5 carbon atoms, a cyclic alkyl group having 5 to 6 carbon atoms, or aromatic hydrocarbon group. The alkyl group or aromatic hydrocarbon group may contain a hetero atom such as oxygen atom, nitrogen atom, or sulfur atom in the structure. Examples of the aromatic hydrocarbon group include phenyl group, tolyl group, xylyl group, mesityl group, phenethyl group, and naphthyl group. All of $R_{31}$ to $R_{36}$ are preferably lower alkyl groups.

a and e each independently represents 1 or more, and preferably an integer of 1 to 2, f is 0 or 1 or more, and preferably an integer of less than 2, and a+e+f is 5 or less.

b and h each independently represents 1 or more, and preferably an integer of 1 to 2, g is 0 or 1 or more, and preferably an integer of less than 2, and b+h+g is 5 or less.

c and i each independently represents 1 or more, and preferably an integer of 1 to 2, j is 0 or 1 or more, and preferably an integer of less than 2, and c+i+j is 5 or less.

d is 1 or more, and preferably an integer of 1 to 2, k and l each independently represents 0 or 1 or more, and preferably an integer of less than 2, and also d+k+l is 3 or less.

In the present invention, the molecular weight polyhydric phenol compound (a) must be within a range from 300 to 2,500, preferably from 450 to 1,500, and more preferably from 500 to 1,200. When the molecular weight is the upper limit or less, roughness is reduced and the pattern shape is further improved, and also resolution is improved. When the molecular weight is the lower limit or more, a resist pattern having good profile can be formed.

Also, the molecular weight dispersion degree (Mw/Mn) of the polyhydric phenol compound (a) is preferably 1.5 or less because of excellent effects of the present invention. The reason is considered as follows. That is, when the polyhydric phenol compound (a) has so narrow molecular weight distribution dispersion degree as 1.5 or less, even if the polyhydric phenol material contains a plurality of compounds (A1) each having a different number of phenolic hydroxyl groups protected with an acid dissociable dissolution inhibiting group (protection number), alkali solubility of each compound (A1) becomes comparatively uniform. The dispersion degree is preferably small, more preferably 1.4 or less, and most preferably 1.3 or less.

The dispersion degree is commonly used in a polydisperse compound such as polymer. Even in the case of a monodisperse compound, when analyzed by gel permeation chromatography (GPC), molecular weight distribution apparently arises occasionally because of the presence of impurities such as by-product upon preparation and remained starting substance. In other words, in the case of the monodisperse compound, the dispersion degree of 1 means purity of 100%. As the dispersion degree increases, the amount of impurities increases. In the present invention, the dispersion degree can be determined by measuring Mw and Mn using a method of measuring a weight average molecular weight (Mw) and a number average molecular weight (Mn) of a polymer used commonly with respect to a compound which shows apparent molecular weight distribution, for example, GPC and determining a ratio Mw/Mn.

The dispersion degree can be adjusted by purifying to remove reaction by-products and impurities and removing the unrequited molecular weight moiety using a known method such as molecular weight fractionation treatment after synthesizing a polyhydric phenol compound (a) as the final objective product.

It is necessary that the polyhydric phenol compound (a) is a material capable of forming an amorphous film by a spin coating method. As used herein, the amorphous film means an optically transparent film which is not crystallized. The spin coating method is one of conventional film forming methods and it can be discriminated, whether or not a polyhydric phenol compound is a material capable of forming an amorphous film by a spin coating method, by the fact that a coating film formed on a 8 inch silicone wafer by the spin coating method is entirely transparent or not. More specifically, it can be discriminated in the following manner. First, the polyhydric phenol material is dissolved in a solvent commonly used as a resist solvent, for example, a mixed solvent of ethyl lactate and propylene glycol monomethyl ether acetate in a mixing ratio of 40/60 (mass ratio) (hereinafter abbreviated to EM) prepared by subjecting to an ultrasonic treatment (dissolution treatment) using an ultrasonic washer to obtain a solution having a concentration of 14% by mass. The solution is spin coated on a wafer at 1,500 rpm and optionally subjected to post applied baking (PAB) at 110° C. for 90 seconds. It is confirmed by visual observation whether or not a transparent amorphous film is formed. An opaque film is not an amorphous film.

In the present invention, the amorphous film thus formed of the polyhydric phenol compound (a) is preferably excellent in stability and, for example, the amorphous state is preferably maintained even after the amorphous film is allowed to stand at room temperature for 2 weeks after PAB.

The compound (A1) is a compound in which a portion or all of hydrogen atoms of a hydroxyl group of a phenolic hydroxyl group of the polyhydric phenol compound (a) are substituted with at least one selected from the group consisting of acid dissociable dissolution inhibiting groups represented by the general formulas (p1) and (p2).

In the case of mixing the compound (A1) with a resist composition, together with an acid generator component (B) which generates an acid upon exposure, the acid dissociable dissolution inhibiting group is dissociated when reacted with an acid generated from the acid generator component (B) upon exposure. It is a so-called acid dissociable dissolution inhibiting group having alkali dissolution inhibition properties, which enable the entire the compound (A1) to be insoluble in an alkali before dissociation, and enables the entire compound (A1) to be soluble in an alkali after dissociation.

In the present invention, as long as the effects of the present invention are not adversely affected, a portion of hydrogen atoms of a phenolic hydroxyl group in the compound (A1) may be substituted with an acid dissociable dissolution inhibiting group other than a group represented by the formula (p1) or (p2). Such an acid dissociable dissolution inhibiting group is not specifically limited and it is possible to use by appropriately selecting from those proposed in a hydroxystyrene-based resin and a (meth)acrylic acid-based resin used in a chemically amplified photoresist composition for KrF or ArF.

Specific examples thereof include linear alkoxyalkyl group, tertiary alkyloxycarbonyl group, tertiary alkyl group, and cyclic ether group.

Specific examples of the linear alkoxyalkyl group include 1-ethoxyethyl group, 1-ethoxymethyl group, 1-methoxymethylethyl group, 1-methoxymethyl group, 1-isopropoxyethyl group, 1-methoxypropyl group, and 1-ethoxypropyl group, 1-n-butoxyethyl group.

Specific examples of the tertiary alkyloxycarbonyl group include tert-butyloxycarbonyl group and tert-amyloxycarbonyl group.

Specific examples of the tertiary alkyl group include chain tertiary alkyl group such as tert-butyl group or tert-amyl group; and tertiary alkyl group having an aliphatic polycyclic group such as 2-methyl-adamantyl group or 2-ethyladamantyl group.

Specific examples of the cyclic ether group include tetrahydropyranyl group and tetrahydrofuranyl group.

Among these groups, a linear alkoxyalkyl group is preferable and a 1-ethoxyethyl group and a 1-ethoxymethyl group are more preferable because it is possible to attain excellent dissociation, enhance uniformity of the compound (A1) and improve LER.

The compound (A1) can be prepared, for example, by substituting a portion or all of hydrogen atoms of a phenolic hydroxyl group of the polyhydric phenol compound (a) with an acid dissociable dissolution inhibiting group (a group represented by the formula (p1) or (p2), and an optional other acid dissociable dissolution inhibiting group) using a known method.

The polyhydric phenol compound (a) can be synthesized, for example, by dissolving a bissalicylaldehyde derivative and a phenol derivative (about 4 equivalents based on the bissalicylaldehyde derivative) in an organic solvent and reacting under acidic conditions.

<<Dissolution Inhibitor>>

The compound (A1) of the present invention can also be preferably used as a dissolution inhibitor. By using the dissolution inhibitor, dissolution contrast is improved and thus resolution and resist pattern shape are improved. The dissolution inhibitor of the present invention can be added to a two-component chemically amplified photoresist composition containing a resin component having a protective group and an acid generator, and also can be used in a three-component chemically amplified resist composition containing a resin component having no protective group, an acid generator and the compound (A1) of the present invention as the dissolution inhibitor.

<<Resist Composition>>

The resist composition of the present invention contains a base material component (A) having an acid dissociable dissolution inhibiting group in which alkali solubility enhances under an action of an acid (hereinafter sometimes referred to as a component (A)), and an acid generator component (B) which generates an acid upon exposure (hereinafter sometimes referred to as a component (B)).

In the component (A), when reacted with an acid generated from the acid generator component (B) upon exposure, the acid dissociable dissolution inhibiting group is dissociated and thus the entire component (A) becomes soluble in an alkali from insoluble in an alkali. Therefore, when a resist film made of the resist composition is selectively exposed in the formation of a resist pattern, or subjected to post exposure baking in addition to the exposure, the exposed area becomes soluble in an alkali, while the unexposed area remains insoluble in an alkali, and thus a positive resist pattern can be formed by developing with an alkali.

In the resist composition of the present invention, the component (A) must contain the compound (A1) of the present invention.

These compounds (A1) may be used alone or in combination.

In the case of containing, as the compound (A1), plural compounds each having a different number (protection number) of phenolic hydroxyl groups (hereinafter sometimes referred to as "plural different compounds") in which the polyhydric phenol compound (a) has the same structure and also hydrogen atoms are substituted with an acid dissociable dissolution inhibiting group (a group represented by the formula (p1) or (p2), and optional other acid dissociable dissolution inhibiting groups) (hereinafter sometimes referred merely that "a phenolic hydroxyl group is protected"), the respective protection numbers of plural different compounds are preferably closer because of excellent effects of the present invention.

The proportion of plural different compounds in the compound (A1) can be measured by means such as reverse phase chromatography.

The protection number in plural different compounds can be adjusted by the conditions in the case of protecting a phenolic hydroxyl group of the polyhydric phenol compound (a) with the acid dissociable dissolution inhibiting group.

The proportion of the compound (A1) in the component (A) is preferably more than 40 mass %, more preferably more than 50 mass %, still more preferably more than 80 mass %, and most preferably 100 mass %.

The proportion of the compound (A1) in the component (A) can be measured by means such as reverse phase chromatography.

The component (A) may contain those in which the phenolic hydroxyl group in the polyhydric phenol compound (a) is not protected with acid dissociable dissolution inhibiting group at all, that is, the polyhydric phenol compound (a) itself.

The proportion of the polyhydric phenol compound (a) in the component (A) is preferably as small as possible, more preferably 60 mass % or less, still more preferably 50 mass % or less, further more preferably 10 mass % or less, and most preferably 0 mass %. When the proportion of the polyhydric phenol compound (a) is 60 mass % or less, roughness can be reduced when a pattern is formed. Also, resolution is excellent.

The proportion of the polyhydric phenol compound (a) in the component (A) can be adjusted, for example, by removing the polyhydric phenol compound (a) using gel permeation chromatography (GPC).

The proportion of the polyhydric phenol compound (a) in the component (A) can be measured by means such as reverse phase chromatography.

In the component (A), a protection rate of a phenolic hydroxyl group in the component (A), that is, the proportion of phenolic hydroxyl groups protected with an acid dissociable dissolution inhibiting group based on the total amount of phenolic hydroxyl groups protected with an acid dissociable dissolution inhibiting group and phenolic hydroxyl groups which are not protected with an acid dissociable dissolution inhibiting group can be appropriately decided taking account of the structure of the polyhydric phenol compound (a), the number of the phenolic hydroxyl group, and desired various lithography properties. For example, the proportion is preferably from 5 to 50 mol %, more preferably from 7 to 45 mol %, and still more preferably from 15 to 45 mol %, taking account of resolution and the roughness reducing effect.

The component (A) may further contain an optional resin component proposed as a base material component of a chemically amplified photoresist layer (hereinafter sometimes referred to as a component (A3)) as long as the effects of the present invention are not adversely affected.

Such as component (A3) includes, for example, those proposed as a base resin of a conventional chemically amplified positive resist composition for KrF or a positive resist composition for ArF, and can be appropriately selected according to the kind of an exposure light source used upon formation of a resist pattern.

The content of the component (A) in the resist composition of the present invention may be adjusted according to the thickness of a resist film to be formed.

The component (B) is not specifically limited and those proposed as an acid generator for a chemically amplified photoresist can be used. As the acid generator, there have hitherto been known various acid generators, for example, onium salt-based acid generators such as iodonium salt and sulfonium salt; diazomethane-based acid generators such as bisalkyl or bisarylsulfonyldiazomethanes; iminosulfonate-based acid generators such as poly(bissulfonyl)diazomethanes, and disulfone-based acid generators Examples of the onium salt-based acid generators include compounds represented by the following general formulas (b-1) and (b-2):

[Chemical Formula 12]

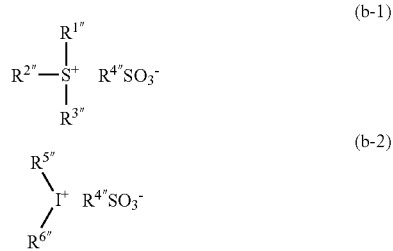

wherein $R^{1\prime\prime}$ to $R^{3\prime\prime}$ each independently represents an aryl group or an alkyl group; $R^{4\prime\prime}$ represents a linear, branched or cyclic alkyl group or fluorinated alkyl group; at least one of $R^{1\prime\prime}$ to $R^{3\prime\prime}$ represents an aryl group; and at least one of $R^{5\prime\prime}$ to $R^{6\prime\prime}$ represents an aryl group.

In the formula (b-1), $R^{1\prime\prime}$ to $R^{3\prime\prime}$ each independently represents aryl group or alkyl group. At least one of $R^{1\prime\prime}$ to $R^{3\prime\prime}$ represents an aryl group, Two or more of $R^{1\prime\prime}$ to $R^{3\prime\prime}$ are preferably aryl groups and all of $R^{1\prime\prime}$ to $R^{3\prime\prime}$ are most preferably aryl groups.

The aryl group of $R^{1\prime\prime}$ to $R^{3\prime\prime}$ is not specifically limited and is, for example, an aryl group having 6 to 20 carbon atoms and a portion or all of hydrogen atoms of the aryl group may be substituted or not substituted with an alkyl group, an alkoxy group or a halogen atom. The aryl group is preferably an aryl group having 6 to 10 carbon atoms because it is possible to synthesis at low price. Specific examples thereof include phenyl group and naphthyl group.

The alkyl group in which hydrogen atoms of the aryl group may be substituted is preferably an alkyl group having 1 to 5 carbon atoms, and a methyl group, an ethyl group, a propyl group, an n-butyl group, and a tert-butyl group are most preferable.

The alkoxy group in which hydrogen atoms of the aryl group may be substituted is preferably an alkoxy group having 1 to 5 carbon atoms, and a methoxy group and an ethoxy group are most preferable.

The halogen atom in which hydrogen atoms of the aryl group may be substituted is preferably a fluorine atom.

The alkyl group of $R^{1\prime\prime}$ to $R^{3\prime\prime}$ is not specifically limited and is, for example, a linear, branched or cyclic alkyl group having 1 to 10 carbon atoms. In view of excellent resolution, the number of carbon atoms is preferably from 1 to 5. Specific examples thereof include methyl group, ethyl group, n-propyl group, isopropyl group, n-butyl group, isobutyl group, n-pentyl group, cyclopentyl group, hexyl group, cyclohexyl group, nonyl group, and decanyl group. Among these groups, a methyl group is preferable because resolution is excellent and it is possible to synthesize at low price.

Among these groups, all of $R^1$ to $R^3$ are most preferably phenyl groups.

In the formula (b-2), $R^{5\prime\prime}$ to $R^{6\prime\prime}$ each independently represents an aryl group or an alkyl group. At least one of $R^{5\prime\prime}$ to $R^{6\prime\prime}$ represents an aryl group. Two or more of $R^{5\prime\prime}$ to $R^{6\prime\prime}$ are preferably aryl groups and all of $R^{5\prime\prime}$ to $R^{6\prime\prime}$ are most preferably aryl groups.

Examples of the aryl group of $R^{5\prime\prime}$ to $R^{6\prime\prime}$ include the same aryl group as that of $R^{1\prime\prime}$ to $R^{3\prime\prime}$.

Examples of the alkyl group of $R^{5\prime\prime}$ to $R^{6\prime\prime}$ include the same alkyl group as that of $R^{1\prime\prime}$ to $R^{3\prime\prime}$.

All of $R^{5\prime\prime}$ to $R^{6\prime\prime}$ are most preferably phenyl groups.

$R^{4\prime\prime}$ in the general formula (b-1) and (b-2) is most preferably a linear or cyclic alkyl group, or a fluorinated alkyl group.

The linear alkyl group preferably has 1 to 10 carbon atoms, more preferably 1 to 8 carbon atoms, and most preferably 1 to 4 carbon atoms.

The cyclic alkyl group is a cyclic group as shown in $R^1$ and preferably has 4 to 15 carbon atoms, 4 to 10 carbon atoms, and most preferably 6 to 10 carbon atoms.

The fluorinated alkyl group preferably 1 to 10 carbon atoms, more preferably 1 to 8 carbon atoms, and most preferably 1 to 4 carbon atoms. Also, a fluorination rate of the fluorinated alkyl group (the proportion of fluorine atoms in an alkyl group) is preferably from 10 to 100%, and more preferably from 50 to 100%. It is particularly preferable that all hydrogen atoms are substituted with a fluorine atom, because the strength of an acid increases.

Specific examples of the onium salt-based acid generator include trifluoromethanesulfonate or nonafluorobutanesulfonate of diphenyliodonium, trifluoromethanesulfonate or nonafluorobutanesulfonate of bis(4-tert-butylphenyl)iodonium, trifluoromethanesulfonate of triphenylsulfonium, heptafluoropropanesulfonate thereof or nonafluorobutanesulfonate thereof, trifluoromethanesulfonate of tri(4-methylphenyl)sulfonium, heptafluoropropanesulfonate thereof or nonafluorobutanesulfonate thereof, trifluoromethanesulfonate of dimethyl(4-hydroxynaphthyl)sulfonium, heptafluoropropanesulfonate thereof or nonafluorobutanesulfonate thereof, trifluoromethanesulfonate of monophenyldimethylsulfonium, heptafluoropropanesulfonate thereof or nonafluorobutanesulfonate thereof, trifluoromethanesulfonate of diphenylmonomethylsulfonium, heptafluoropropanesulfonate thereof or nonafluorobutanesulfonate thereof, trifluoromethanesulfonate of (4-methylphenyl)diphenylsulfonium, heptafluoropropanesulfonate thereof or nonafluorobutanesulfonate thereof, trifluoromethanesulfonate of (4-methoxyphenyl)diphenylsulfonium, heptafluoropropanesulfonate thereof or nonafluorobutanesulfonate thereof, trifluoromethanesulfonate of tri(4-tert-butyl)phenylsulfonium, heptafluoropropanesulfonate thereof or nonafluorobutanesulfonate thereof, and trifluoromethanesulfonate of diphenyl(1-(6-methoxy)naphthyl)sulfonium, heptafluoropropanesulfonate thereof or nonafluorobutanesulfonate thereof. It is also possible to use onium salts in which the anion moiety of these onium salts are replaced by methanesulfonate, n-propanesulfonate, n-butanesulfonate, or n-octanesulfonate.

It is also possible to use those in which an anion moiety is replaced by an anion moiety represented by the following general formula (b-3) or (b-4) (a cation moiety is the same as in case of (b-1) or (b-2)) in the general formula (b-1) or (b-2):

[Chemical Formula 13]

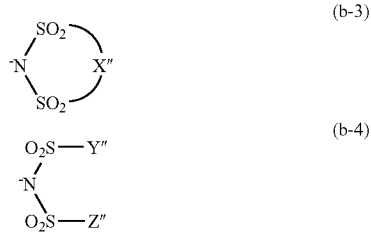

wherein X" represents an alkylene group having 2 to 6 carbon atoms in which at least one hydrogen atom is substituted with a fluorine atom; and Y" and Z" each independently represents an alkyl group having 1 to 10 carbon atoms in which at least one hydrogen atom is substituted with a fluorine atom.

X" represents a linear or branched alkylene group in which at least one hydrogen atom is substituted with a fluorine atom, and the number of carbon atoms of the alkylene group is from 2 to 6, preferably from 3 to 5, and most preferably 3.

Y" and Z" each independently represents a linear or branched alkyl group in which at least one hydrogen atom is substituted with a fluorine atom, and the number of carbon atoms of the alkyl group is from 1 to 10, preferably from 1 to 7, and more preferably from 1 to 3.

The number of carbon atoms of the alkylene group of X" or the number of carbon atoms of the alkyl group of Y" and Z" is preferably as small as possible because solubility in a resist solvent is good within the above range of the number of carbon atoms.

In the alkylene group of X" or the alkyl group of Y" and Z", the number of hydrogen atoms substituted with a fluorine atom is preferably as large as possible because the strength of an acid increases and transparency to high energy light of 200 nm or less or electron beam is improved. The proportion of fluorine atoms in the alkylene group or alkyl group, that is, a fluorination rate is preferably from 70 to 100%, and more preferably from 90 to 100%. A perfluoroalkylene or perfluoroalkyl group in which all hydrogen atoms are substituted with a fluorine atom is most preferable.

Specific examples of the oximesulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thein-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Among these, α-(methylsulfonyloxyimino)-p-methoxyphenylacetonitrile is preferable.

Also, oximesulfonate-based acid generators represented by the following chemical formulas can be used.

[Chemical Formula 14]

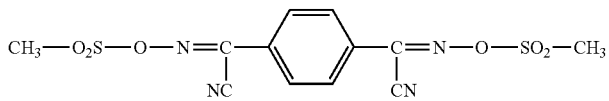

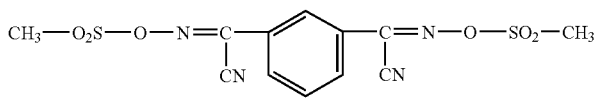

-continued

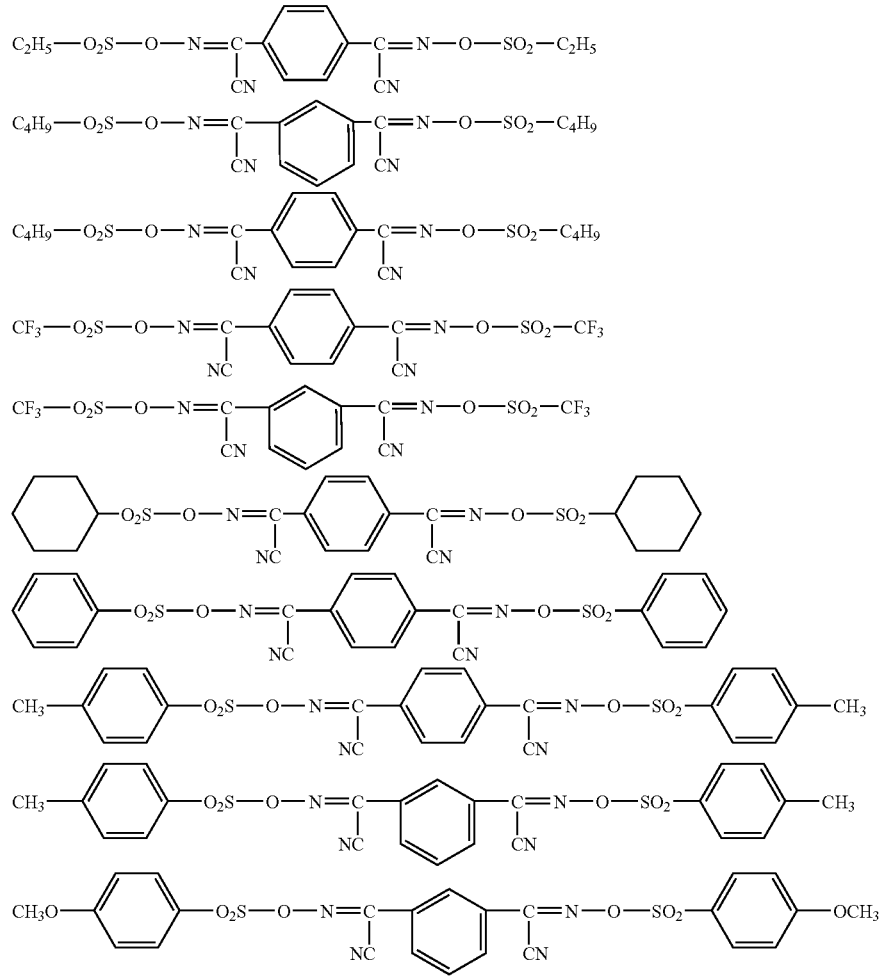

[Chemical Formula 15]

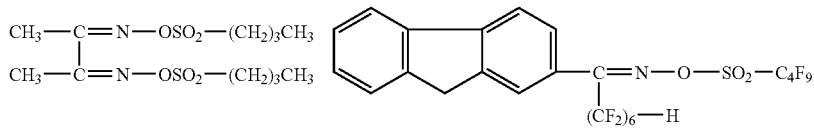

Among the diazomethane-based acid generator, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of poly(bissulfonyl)diazomethanes include 1,3-bis(phenylsulfonyldiazomethylsulfonyl)propane (compound A), 1,4-bis(phenylsulfonyldiazomethylsulfonyl)butane (compound B), 1,6-bis(phenylsulfonyldiazomethylsulfonyl)hexane (compound C), 1,10-bis(phenylsulfonyldiazomethylsulfonyl)decane (compound D), 1,2-bis(cyclohexylsulfonyldiazomethylsulfonyl)ethane (compound E), 1,3-bis(cyclohexylsulfonyldiazomethylsulfonyl)propane (compound F), 1,6-bis(cyclohexylsulfonyldiazomethylsulfonyl)hexane (compound G), and 1,10-bis(cyclohexylsulfonyldiazomethylsulfonyl)decane (compound H), each having the following structure.

[Chemical Formula 16]

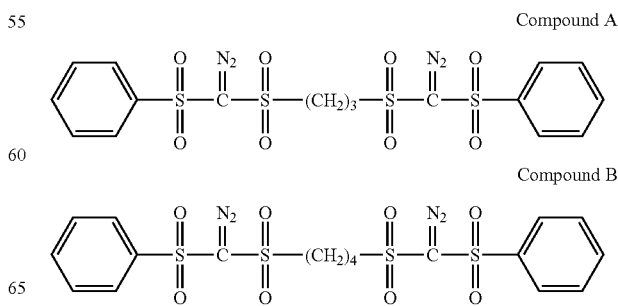

-continued

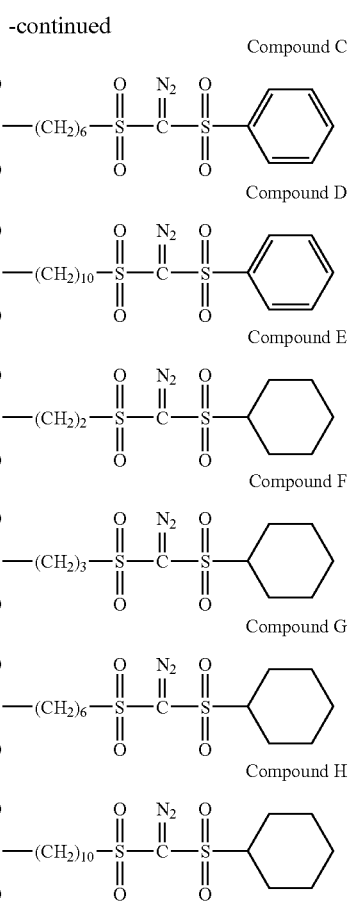

In the present invention, it is preferable to use, as the component (B), an onium salt-based acid generator containing fluorinated alkylsulfonic acid ions or alkylsulfonic acid ions as anions.

As the component (B), these acid generators may be used alone or in combination.

The content of the component (B) is adjusted within a range from 0.5 to 30 parts by mass, and preferably from 1 to 10 parts by mass, based on 100 parts by mass of the component (A). A pattern is sufficiently formed by adjusting the content within the above range. It is preferable that a uniform solution is obtained and storage stability is improved.

The positive resist composition of the present invention can be prepared by dissolving the component (A) the component (B) and optional components described hereinafter in an organic solvent (hereinafter sometimes referred to as a component (C)).

The component (C) may be any organic solvent which can dissolve the respective components to give a uniform solution, and one or more kinds of any organic solvents selected appropriately from among those known as a solvent for a chemically amplified photoresist can be used.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and monomethylether, monoethylether, monopropylether, monobutylether or monophenylether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used alone or in combination.

A mixed solvent prepared by mixing propylene glycol monomethylether acetate (PGMEA) with a polar solvent is preferable. The mixing ratio (mass ratio) may be appropriately decided taking account of compatibility between PGMEA and a polar solvent, and is preferably from 1:9 to 9:1, and more preferably from 2:8 to 8:2. More specifically, when EL is mixed as the polar solvent, a mass ratio PGMEA:EL is preferably from 1:9 to 9:1, and more preferably from 2:8 to 8:2.

In addition, the organic solvent is preferably a mixed solvent of at least one selected from PGMEA and EL, and γ-butyrolactone. In this case, the mixing ratio, that is, the mass ratio of the former to the later is preferably from 70:30 to 95:5.

The amount of the component (C) is not specifically limited and is appropriately set according to the thickness of the coating film so as to adjust to the concentration which enables coating on a substrate, and is preferably adjusted so that the solid content of the resist composition is commonly within a range from 2 to 20% by mass, and preferably 5 to 15% by mass.

The positive resist composition of the present invention can further contain, as an optional component, a nitrogen-containing organic compound (D) (hereinafter referred to as a component (D)) so as to improve resist pattern shape and post exposure stability of the latent image formed by the pattern wise exposure of the resist layer.

Since various ones are proposed as the component (D) any one may selected from known ones may be used and examples thereof include monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or dicyclohexylamine; trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamine such as diethanolamine, triethanolamine, diisopropanolamine, triisopropanolamine, di-n-octanolamine, or tri-n-octanolamine. Among these, a secondary aliphatic amine and a tertiary aliphatic amine are preferable, trialkylamine having 5 to 10 carbon atoms is more preferable, and tri-n-octylamine is most preferable.

These components may be used alone or in combination.

The component (D) is commonly used in an amount within a range from 0.01 to 5.0 parts by mass based on 100 parts by mass of the component (A).

The positive resist composition of the present invention can further contain, as an optional component, an organic carboxylic acid, or oxo acid of phosphorus, or a derivative thereof (E) (hereinafter referred to as a component (E)) for the purpose of preventing deterioration in sensitivity by mixing of the component (D), and improving resist pattern shape, and post exposure delay stability. The components (D) and (E) can be used alone or in combination.

As the organic carboxylic acid, for example, malonic acid, citric acid, malic acid, succinic acid, benzoic acid, and salicylic acid are preferable.

Examples of the oxo acid of phosphorus or the derivative thereof include phosphoric acid or a derivative such as ester thereof, such as phosphoric acid, di-n-butyl phosphate ester, or phenyl phosphate ester; phosphonic acid or a derivative such as ester thereof, such as phosphonic acid, dimethyl phosphonate ester, di-n-butyl phosphonate ester, phenylphosphonic acid, diphenyl phosphonate ester, or dibenzyl phosphonate ester; and phosphinic acid or a derivative such as ester thereof, such as phosphinic acid or phenylphosphinic acid. Among these, phosphonic acid is particularly preferable.

The component (E) is commonly used in the proportion within a range from 0.01 to 5.0 parts by mass based on 100 parts by mass of the component (A).

To the positive resist composition of the present invention, if desired, additives having miscibility, for example, additive resins for improving performances of a resist film, surfactants for improving coatability, dissolution inhibitors, plasticizers, stabilizers, colorants, antihalation agents, and dyes can be appropriately added.

<<Resist Pattern Forming Method>>

A resist pattern forming method of the present invention comprises the steps of forming a resist film on a substrate using the above resist composition of the present invention, exposing the resist film, and developing the resist film to form a resist pattern. More specifically, a resist pattern can be formed by the following resist pattern forming method. First, the above positive resist composition is coated on a substrate such as silicone wafer using a spinner, and optionally prebaked (PAB) to form a resist film. The resist film thus formed is selectively exposed by exposure through a mask pattern or by drawing with direct irradiation with electron beam through no mask pattern using an exposure apparatus such as electron beam lithography system or EUV exposure apparatus, and then subjected to post exposure baking (PEB). After developing with an alkali developing solution, the developing solution on the substrate and the resist composition dissolved by the developing solution are washed away by a rinsing treatment, followed by drying to obtain a resist pattern.

These steps can be conducted using a known method. Preferably, the operation conditions are appropriately set according to the composition of the positive resist composition to be used and properties.

The exposure light source is not specifically limited and the exposure can be conducted using radiations such as ArF excimer laser, KrF excimer laser, $F_2$ laser, EUV (extreme ultra violet), VUV (vacuum ultraviolet rays), electron beam, X-rays, and soft X-rays. The positive resist composition of the present invention is effective to electron beam or EUV, particularly electron beam.

The alkali developing solution is not specifically limited and commonly used alkali developing solutions can be used. The alkali developing solution includes, for example, an aqueous alkali solution prepared by dissolving an organic alkali such as tetramethylammonium hydroxide (TMAH) trimethylmonoethylammonium hydroxide, dimethyldiethylammonium hydroxide, monomethyltriethylammonium hydroxide, or trimethylmonobutylammonium hydroxide in water.

The concentration of an alkali in the alkali developing solution is not specifically limited as long as it is the same concentration as that in the case of using as a developing solution and varies depending on the kind of the resist, but is preferably from 0.1 to 10% by mass, more preferably from 0.5 to 5% by mass, and still more preferably from 2.0 to 3.5% by mass because of forming a fine pattern while preventing the pattern from collapsing.

To the alkali developing solution, if necessary, additives used conventionally in an alkali developing solution for a conventional resist, for example, humectants, stabilizers, solubilizing aids, and surfactants may be added. These additive components may be used alone or in combination.

In some case, the method may include the post baking step after the alkali development, and an organic or inorganic antireflective film may be provided between the substrate and the resist film.

As described above, according to a compound (A1), a resist composition containing the compound (A1), and a resist forming method using the resist composition of the present invention, a resist pattern having excellent resolution and shape can be formed.

The reason is considered as follows. That is, in a resist using a compound in which a phenolic hydroxyl group of a low molecular weight polyhydric phenol compound is protected with an acid dissociable dissolution inhibiting group, when hydrogen atoms of the phenolic hydroxyl group have a phenolic hydroxyl group which is not substituted with the acid dissociable dissolution inhibiting group, an intermolecular interaction increases due to formation of a hydrogen bond and heat resistance of the resist is improved, and thus a pattern can be sufficiently formed when heated at a conventional baking temperature, for example, a temperature of 100° C. or higher. With the increase of a demand for high resolution, it is considered to increase a protection rate of the phenolic hydroxyl group as one technique of enhancing resolution. However, when the protection rate increases, the number of hydroxyl groups decreases and an intermolecular force decreases, resulting in deterioration of heat resistance, and thus it becomes impossible to form a resist pattern (pattern forming ability deteriorates). On the other hand, when the protection rate is decreased so as to enhance pattern forming ability, resolution deteriorates decreases and alkali solubility becomes too high, resulting in small difference in solubility in a developing solution between the exposed area and the unexposed area (dissolution contrast) and thus it becomes difficult to form a pattern. To the contrary, a group represented by the formula (p1) or (p2) used in the present invention has a bulky group such as branched or cyclic alkyl group and therefore high dissolution inhibition action is exerted. Accordingly, sufficiently high dissolution contrast is obtained even in the case of low protection rate and also a lot of hydroxyl groups are remained, and therefore pattern forming ability is maintained by an intermolecular hydrogen bond through a hydroxyl group, and thus a resist pattern having excellent resolution and shape can be formed.

EXAMPLES

Examples of the present invention will now be described, but the scope of the present invention is not limited to the following Examples.

Preparation Example 1

Synthesis of Protector (3) of Low Molecular Phenol Compound (1)

10 g of a low molecular compound (1) (manufactured by Honsyu Chemical Industry Co., Ltd.) was dissolved in 50 g of tetrahydrofuran (THF) and 1.12 g of 60 mass % sodium hydride (NaH) was added at 0° C., followed by stirring for 10 minutes, addition of 8.01 g of bromoacetic acid-2-methyl-2-adamantyl (5) and further stirring at room temperature (r.t.) for 5 hours. After the completion of the reaction, the reaction solution was extracted and purified with water/ethyl acetate, and the separated ethyl acetate solution was dried over sodium sulfate and concentrated under reduced pressure to obtain 15.0 g of a protector (3).

A protection rate of the protector (3) (percentage in which R is a group represented by the following formula (5') of R in the following formula (3), calculated by $^1$H-NMR) was 30.2 mol %.

$^1$H-NMR (deuterated dimethyl sulfoxide (DMSO), internal standard: tetramethylsilane) δ=8.75-9.08 (m 3.76H), 6.33-6.80 (m 14H), 5.60-5.96 (m 2H), 4.48-4.75 (m 3.62H), 3.41-3.63 (m 2H), 1.35-2.25 (m 58.43H)

[Chemical Formula 17]

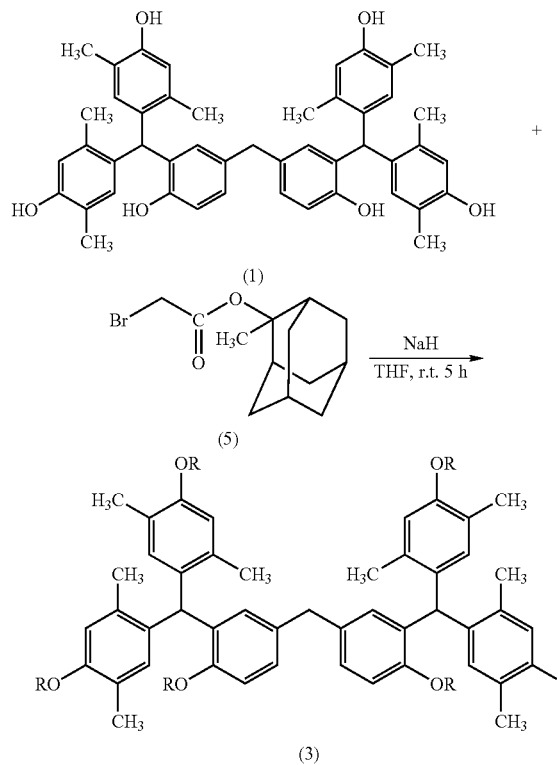

In the formula (3), R is a hydrogen atom or a group represented by the following formula (5').

[Chemical Formula 18]

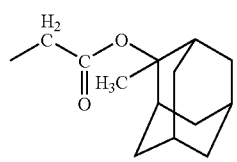

Preparation Example 2

Synthesis of Protector (4) of Low Molecular Phenol Compound (2)

10 g of a low molecular compound (represented by the following formula (2), manufactured by Honsyu Chemical Industry Co., Ltd.) was dissolved in 30 g of THF and 0.84 g of 60 mass % NaH was added at 0° C., followed by stirring for 10 minutes, addition of 5.79 g of bromoacetic acid-2-methyl-2-adamantyl (the following formula (5)) and further stirring at room temperature (r.t.) for 5 hours. After the completion of the reaction, the reaction solution was extracted and purified with water/ethyl acetate, and the separated ethyl acetate solution was dried over sodium sulfate and concentrated under reduced pressure to obtain 13.6 g of a protector (4).

A protection rate of the protector (4) (percentage in which hydrogen atoms of a phenolic hydroxyl group in the protector (4) are substituted with the above formula (5'), calculated by $^1$H-NMR) was 29.5 mol %.

$^1$H-NMR (deuterated DMSO, internal standard: tetramethylsilane) δ=8.70-9.06 (m 3.89H), 6.50-6.80 (m 14H), 5.75-6.00 (m 2H), 4.41-4.72 (m 3.54H), 3.36-3.65 (m 2H), 0.98-2.25 (m 89.63H)

[Chemical Formula 19]

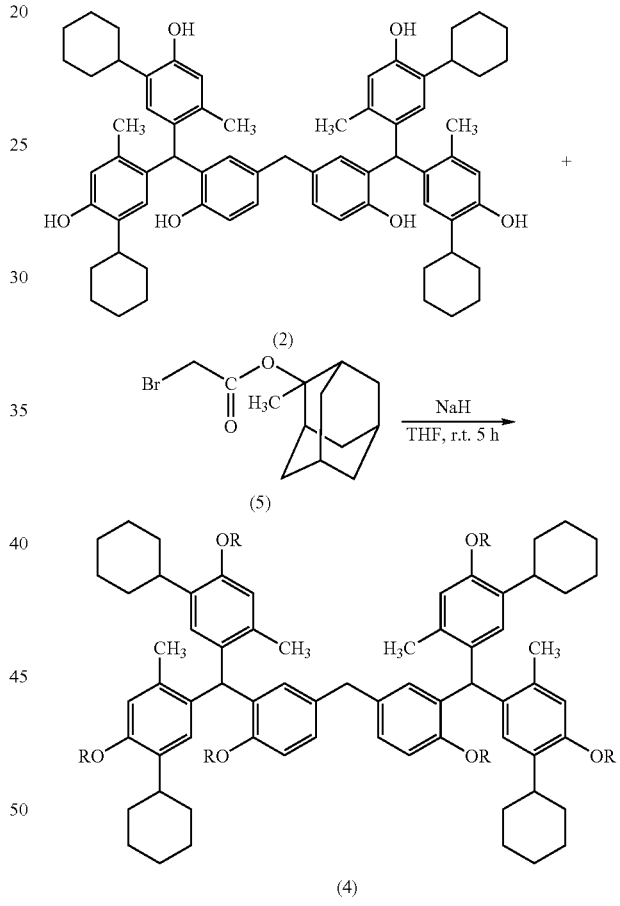

In the formula (4), R is a hydrogen atom or a group represented by the formula (5').

Comparative Preparation Example 1

Synthesis of Protector (6) of Low Molecular Phenol Compound (1)

10 g of a low molecular compound (1) was dissolved in 33 g of tetrahydrofuran and 4.9 g of ethyl vinyl ether was added, followed by reaction with stirring at room temperature for 12 hours. After the completion of the reaction, the reaction solution was extracted and purified with water/ethyl acetate. A protection rate of a protector (6) (percentage in which R is a group represented by the following formula (7') of R in the following formula (6), calculated by $^1$H-NMR) was 50.1 mol %.

[Chemical Formula 20]

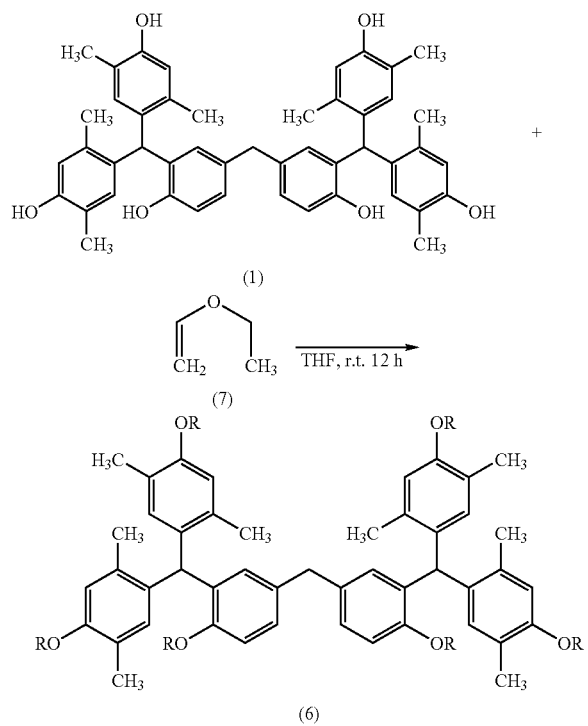

[Chemical Formula 21]

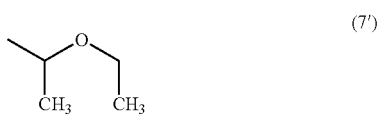

Preparation Example 3

Synthesis of Protector (8) of Low Molecular Phenol Compound (1)

10 g of a low molecular compound (the following formula (1), manufactured by Honsyu Chemical Industry Co., Ltd.) was dissolved in 30 g of THF and 2 g of 60 mass % NaH was added at 0° C., followed by stirring for 10 minutes, addition of 7 g of 2-adamantyl-chloromethylether (the following formula (9)) and further stirring at room temperature (r.t.) for 5 hours. After the completion of the reaction, the reaction solution was extracted and purified with water/ethyl acetate, and the separated ethyl acetate solution was dried over sodium sulfate and concentrated under reduced pressure to obtain 13.0 g of a protector (8).

A protection rate of the protector (8) (percentage in which hydrogen atoms of a phenolic hydroxyl group in the protector (8) are substituted with the above formula (9'), calculated by $^1$H-NMR) was 41.9 mol %.

$^1$H-NMR (deuterated DMSO, internal standard: tetramethylsilane) δ=8.78-9.06 (m 3.21H), 6.24-7.00 (m 14H), 5.62-5.75 (m 2H), 5.14-5.35 (m 5.03H), 3.40-3.58 (m 2H), 1.21-2.11 (m 66.74H)

[Chemical Formula 22]

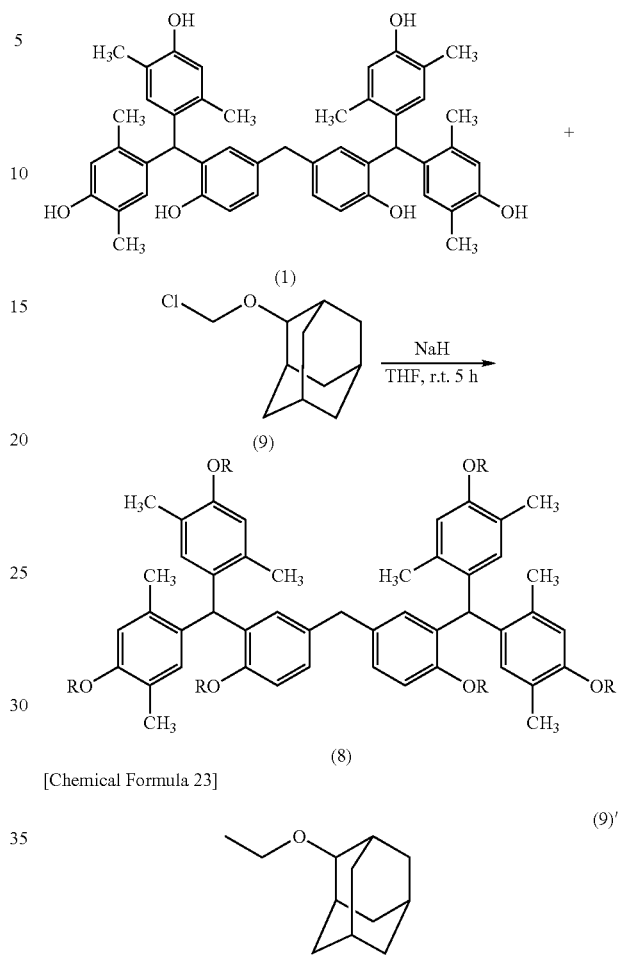

[Chemical Formula 23]

Preparation Example 4

Synthesis of Protector (11) of Low Molecular Phenol Compound (10)

[1] Synthesis of Low Molecular Phenol Compound (10)

First, a compound represented by the following chemical formula (hereinafter abbreviated to a "starting substance 1") was prepared in the following manner.

[Chemical Formula 24]

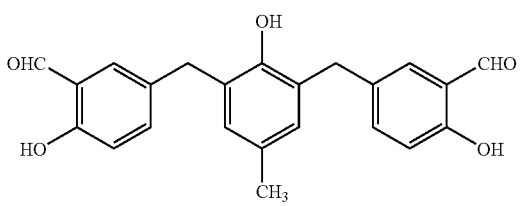

IUPAC Name: 5-({3-[(3-formyl-4-hydroxyphenyl)methyl]-2-hydroxy-5-methylphenyl}methyl)-2-hydroxybenzaldehyde)

Under a nitrogen atmosphere, 244.0 g (2.0 mols) of salicylaldehyde was weighed in a 1 L four-necked flask equipped with a reflux condenser, a thermometer and a stirrer and 244.0 g of an aqueous 75 mass % phosphoric acid solution was added dropwise at room temperature over 30 minutes, followed by mixing.

In the mixed solution, 84.0 g (0.5 mols) of 2,6-bis(hydroxymethyl)-4-methylphenol was intermittently added at 60° C. over 6 hours in the form of powder. Then, stirring was continued for 17 hours. The reaction solution was phase-separated by adding 366.0 g of methyl isobutyl ketone and 235.0 g of an aqueous layer was drawn.

After neutralizing with 80.6 g of an aqueous 16 mass % sodium hydroxide solution, 150 g of water was added, followed by washing with water and phase separation at 80° C. After washing with water and phase separation through the same operation twice and concentrating under reduced pressure to 160° C., 94.0 g of methyl isobutyl ketone was added to the residue at 120° C. and 470.0 g of toluene was added at 110° C., followed by crystallization. The crystal was collected by filtration to obtain 160.6 g of a wet cake.

This wet cake was charged again in a 1 L four-necked flask and dissolved in 240.0 g of methyl isobutyl ketone. After concentrating under normal pressure to 130° C., 184.0 g of toluene was added, followed by concentration under normal pressure to 115° C. Crystallization was conducted by adding 240.0 g of toluene to the residue. The crystal was collected by filtration to obtain 89.7 g (yield: 47.7%) of the objective product.

Attribute data of $^1$H-NMR [deuterated DMSO (dimethyl sulfoxide), internal standard: tetramethylsilane] of the resulting compound are shown Table 1. In the table, "Ph" denotes phenol.

TABLE 1

| Shift value (ppm) | Attribution | Form of signal | Number of Protons |
|---|---|---|---|
| 10.54 | —CHO | s | 2 |
| 10.23 | Ph-OH | s | 2 |
| 8.31 | Ph-OH | s | 1 |
| 7.48-6.73 | Ph-H | m | 8 |
| 3.86 | —CH$_2$ | s | 4 |
| 2.11 | —CH$_3$ | s | 3 |

Then, a low molecular phenol compound (10) represented by the following chemical formula was prepared in the following manner.

IUPAC Name: 4-[(5-{[3-({3-[bis(4-hydroxy-2,5-dimethylphenyl)methyl]-4-hydroxyphenyl}methyl)-2-hydroxy-5-methylphenyl]methyl}-2-hydroxyphenyl)(4-hydroxy-2,5-dimethylphenyl)methyl]-2,5-dimethylphenol In a 3 L four-necked flask equipped with a ball capacitor, a 0-200° C. mercury thermometer, and a stirring rod, 305 g (molecular weight: 122, 2.5 mol) of 2,5-xylenol and 437.3 g (which is 1.68 times by mass larger that that of 2,5-xylenol) of methanol were added and then dissolved by stirring at 30° C. After dissolution, 103.7 g (molecular weight: 36.5, 2.84 mol) of a hydrochloric acid gas was bubbled at 30° C. Furthermore, 188.0 g (molecular weight: 376, 0.5 mol) of a "starting substance 1" was intermittently added at 30° C. over one hour in the form of powder, followed by the reaction.

After stirring at 30° C. for 5 hours, 7.7 g (molecular weight: 98, 0.06 mol) of an aqueous 75 mass % phosphoric acid solution was added and the reaction solution was neutralized at 63° C. or lower by adding dropwise 727.5 g (molecular weight: 40, 2.91 mol) of an aqueous 16 mass % NaOH solution (a crystal was precipitated. After neutralization, the pH was 5.4 [pH was measured by a BCG (Brom Cresol Green) test paper]. After cooling to 32° C., 829.3 g of a wet coarse crystal was obtained by filtration.

829.3 g of the resulting wet coarse crystal, 1268.1 g (which is 1.53 times by mass larger than that of the wet coarse crystal) of methyl isobutyl ketone (MIBK) and 400 g (which is 0.48 times by mass larger than that of the wet coarse crystal) of pure water were charged in a 3 L four-necked flask equipped with a ball capacitor, a 0-200° C. mercury thermometer and a stirring rod and the crystal was completely dissolved by mixing with stirring at 70° C. for 30 minutes.

Then, stirring was terminated and 160.0 g of an aqueous layer of the lower layer portion was drawn. Furthermore, 400 g of pure water was mixed with stirring at 70° C. for 30 minutes and stirring was terminated, and then 394 g of an aqueous layer of the lower layer portion was drawn. Furthermore, 400 g of pure water was mixed with stirring at 70° C. for 30 minutes and stirring was terminated, and then 410.0 g of an aqueous layer of the lower layer portion was drawn. After heating to the inner temperature of 130° C., 1310 g of the solvent was distilled off and 843.2 g (which is 0.98 times by mass larger that that of the wet coarse crystal) of toluene was added to the concentrated internal solution, followed by cooling to 30° C., thereby precipitating a crystal.

The precipitated crystal was collected by filtration and then dried to obtain 381.0 g of the objective product.

[Chemical Formula 25]

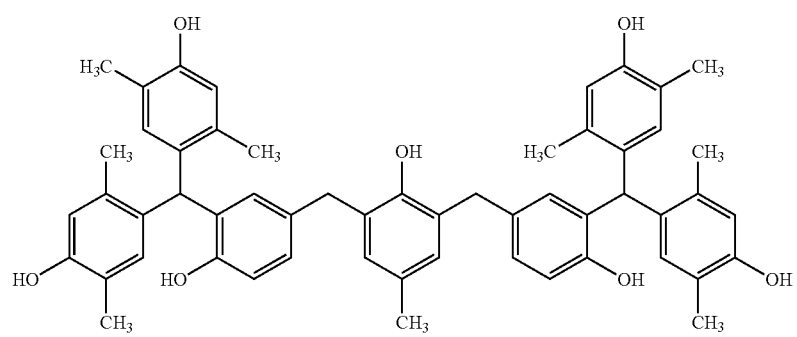

The resulting objective product showed:

Purity: 97.6% (measured by HPLC (high-performance liquid chromatography)),
Melting point: 275.8° C. (DSC: differential scanning calorimeter)
Yield: 93.1% (based on "starting substance 1"), and
Appearance: pale yellow powder (visual observation).

The molecular weight of the resulting objective product was measured by liquid chromatography-mass spectrometry (LC-MS). As a result, it was confirmed that the molecular weight is the objective molecular weight. Attribute data of $^1$H-NMR (deuterated DMSO, internal standard: tetramethylsilane) are shown in Table 2

TABLE 2

| Shift value (ppm) | Attribution | Form of signal | Number of protons |
|---|---|---|---|
| 2.0-2.1 | Ph-CH$_3$ | m | 27 |
| 3.7 | >CH$_2$ | m | 4 |
| 5.7 | >CH— | s | 2 |
| 6.4-6.8 | Ph-H | m | 16 |
| 7.9 | Ph-OH | s | 1 |
| 8.8 | Ph-OH | s | 4 |
| 9.0 | Ph-OH | s | 2 |

[2] Synthesis of Protector (11) of Low Molecular Phenol Compound (10)

10 g of a low molecular phenol compound (10) (the following formula (10), manufactured by Honsyu Chemical Industry Co., Ltd.) was dissolved in 40 g of THF and 1.3 g of 60 mass % NaH was added at 0° C., followed by stirring for 10 minutes, addition of 9.14 g (the following formula (5)) of bromoacetic acid-2-methyl-2-adamantyl and further stirring at room temperature (r.t.) for 5 hours. After the completion of the reaction, the reaction solution was extracted and purified with water/ethyl acetate, and the separated ethyl acetate solution was dried over sodium sulfate and concentrated under reduced pressure to obtain 12.0 g of a protector (11).

A protection rate of the protector (11) (percentage in which hydrogen atoms of a phenolic hydroxyl group in the protector (11) are substituted with the following formula (5'), calculated by $^1$H-NMR) was 25.6 mol %.

$^1$H-NMR (deuterated DMSO, internal standard: tetramethylsilane) δ=8.76-9.05 (m 4.42H), 7.91-8.01 (m 0.79H), 6.30-6.95 (m 16H), 5.64-5.92 (m 2H), 4.49-4.71 (m 3.58H), 3.58-3.79 (m 4H), 1.35-2.25 (m 57.46H)

[Chemical Formula 26]

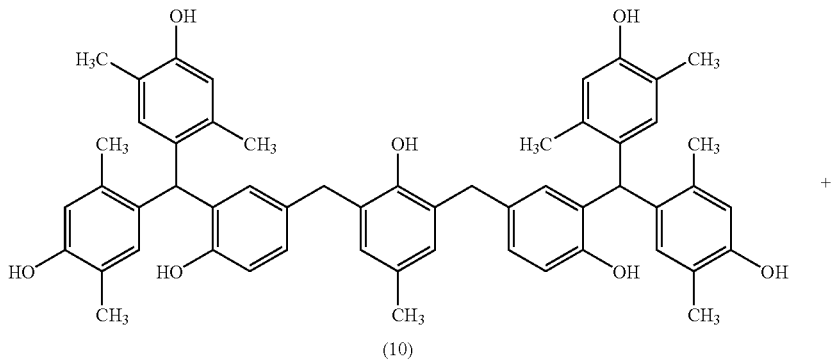

(10)

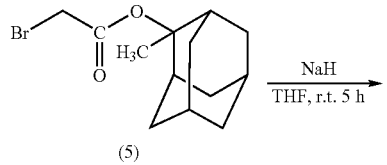

(5)

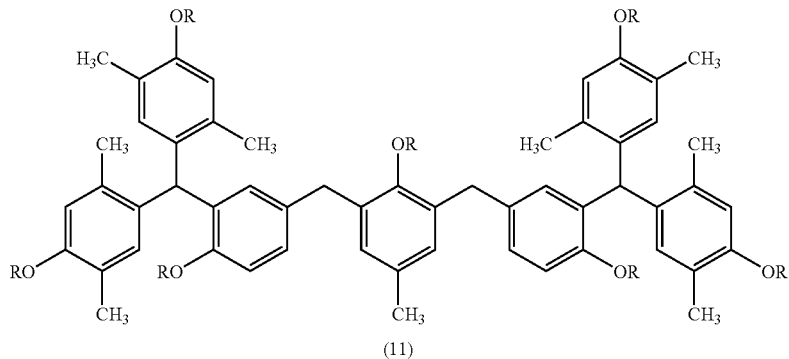

(11)

[Chemical Formula 27]

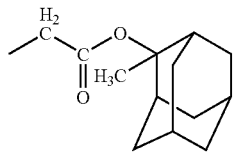

(5')

Preparation Example 5

Synthesis of Protector (12) of Low Molecular Phenol Compound (10)

10 g of a low molecular phenol compound (10) (the following formula (10), manufactured by Honsyu Chemical Industry Co., Ltd.) was dissolved in 50 g of THF and 1.6 g of 60 mass % NaH was added at 0° C., followed by stirring for 10 minutes, addition of 5.5 g (the following formula (9)) of 2-adamantyl-chloromethylether and further stirring at room temperature (r.t.) for 5 hours. After the completion of the reaction, the reaction solution was extracted and purified with water/ethyl acetate, and the separated ethyl acetate solution was dried over sodium sulfate and concentrated under reduced pressure to obtain 11.7 g of a protector (12).

A protection rate of the protector (12) (percentage in which hydrogen atoms of a phenolic hydroxyl group in the protector (12) are substituted with the above formula (9') calculated by $^1$H-NMR) was 30.3 mol %.

$^1$H-NMR (deuterated DMSO, internal standard: tetramethylsilane) δ=8.75-9.08 (m 3.97H), 7.89-8.00 (m 0.91H), 6.25-6.98 (m 16H), 5.64-5.79 (m 2H), 5.12-5.30 (m 4.24H), 3.46-3.75 (m 4H), 1.18-2.15 (m 56.69H)

[Chemical Formula 28]

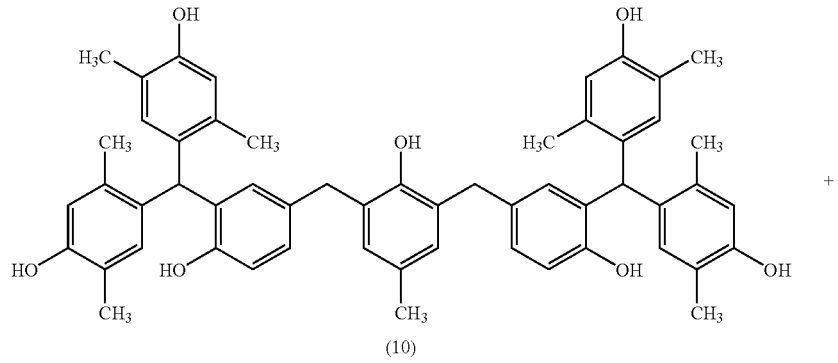

(10)

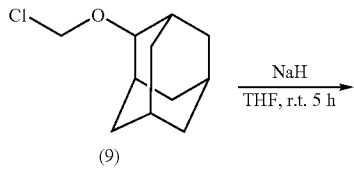

(9)

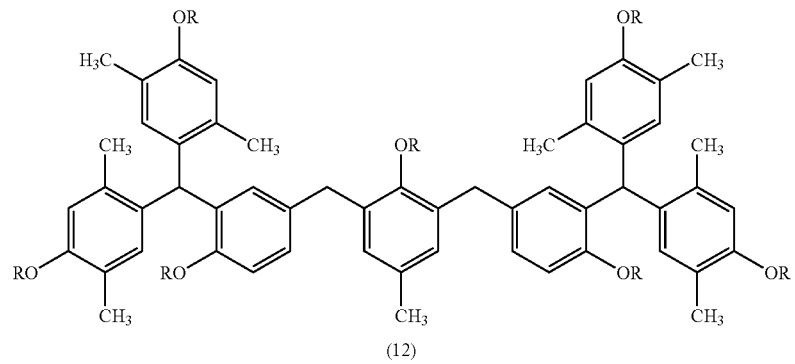

(12)

[Chemical Formula 29]

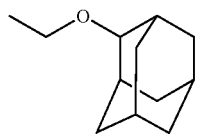

(9')

Example 1

100 Parts by mass of the protector (3) obtained in Preparation Example 1, 10 parts by mass of triphenylsulfonium-nonafluoro-n-butanesulfonate (TPS-PFBS) and 1 part by mass of tri-n-octylamine were dissolved in 1550 parts by mass of a mixed solvent of propyleneglycolmonomethylether acetate (PGMEA) and ethyl lactate (EL) in a mixing ratio of 6:4 (mass ratio) to obtain a positive resist composition solution.

The resulting positive resist composition solution was uniformly coated on a 8 inch silicone substrate subjected to a hexamethyldisilazane treatment using a spinner, followed by subjecting to a prebaking treatment (PAB) at 110° C. for 90 seconds to form a resist film (thickness: 150 nm).

After drawing (exposure) using an electron beam lithography system (manufactured by Hitachi, Ltd., HL-800D (VSB), 70 kV accelerating voltage), the substrate was subjected to post exposure baking (PEB) at 100° C. for 90 seconds, developed with an aqueous 2.38 mass % tetramethylammonium hydroxide (TMAH) solution at 23° C. for 60 seconds and then rinsed with pure water for 30 seconds to form a line-and-space (L/S) pattern.

The resulting resist pattern was subjected to the following evaluations. The results are shown in Table 3.

Using a scanning electron microscope manufactured by Hitachi, Ltd. (measuring SEM, S-9220), light exposure (Eop) at which a pattern of line-and-space (1:1) of 100 nm is formed was determined. As a result, it was 36 µC/cm².

<Resolution>

A L/S pattern was formed at the above Eop and the critical resolution (nm) was determined.

<Shape>

With respect to the L/S pattern of 80 nm formed at the above Eop, the profile was evaluated according to the following criteria using a scanning electron microscope manufactured by Hitachi, Ltd. (measuring SEM, S-9220).

A: Irregularity was scarcely observed on the pattern surface of the line side wall and rectangularity was excellent.

B: Severe irregularity was observed on the pattern surface of the line side wall.

Comparative Example 1

In the same manner as in Example 1, except that the protector (6) obtained in Comparative Preparation Example 1 was used in place of the protector (3), a positive resist composition solution was obtained.

The resulting positive resist composition solution was evaluated in the same manner as in Example 1. At this time, PAB condition was replaced by 80° C. for 90 seconds and PEB condition was replaced by 70° C. for 300 seconds. The results are shown in Table 3.

Example 2

In the same manner as in Example 1, except that the protector (12) obtained in Preparation Example 5 was used in place of the protector (3), a positive resist composition solution was obtained.

The resulting positive resist composition solution was evaluated in the same manner as in Example 1. At this time, PAB condition was replaced by 110° C. for 90 seconds and PEB condition was replaced by 110° C. for 90 seconds. The results are shown in Table 3.

Example 3

In the same manner as in Example 1, except that the protector (8) obtained in Preparation Example 3 was used in place of the protector (3), a positive resist composition solution was obtained.

The resulting positive resist composition solution was evaluated in the same manner as in Example 1. At this time, PAB condition was replaced by 110° C. for 90 seconds and PEB condition was replaced by 110° C. for 90 seconds. The results are shown in Table 3.

Example 4

In the same manner as in Example 1, except that the protector (11) obtained in Preparation Example 4 was used in place of the protector (3), a positive resist composition solution was obtained.

The resulting positive resist composition solution was evaluated in the same manner as in Example 1. At this time, PAB condition was replaced by 110° C. for 90 seconds and PEB condition was replaced by 110° C. for 90 seconds. The results are shown in Table 3.

TABLE 3

|  | Eop (µC/cm²) | Resolution (nm) | Shape |
| --- | --- | --- | --- |
| Example 1 | 36 | 80 | A |
| Example 2 | 26 | 80 | A |
| Example 3 | 26 | 80 | A |
| Example 4 | 36 | 80 | A |
| Comparative Example 1 | 19 | 80 | B |

As is apparent from the above results, the positive resist composition of Examples 1 to 4 showed high resolution and good shape.

On the other hand, the positive resist composition of Comparative Example 1 showed high resolution, but showed very poor shape.

Example 5

100 Parts by mass of the protector (3) obtained in Preparation Example 1, 10 parts by mass of TPS-PFBS, 0.5 parts by mass of tri-n-octylamine and 0.2 parts by mass of salicylic acid were dissolved in 1700 parts by mass of a mixed solvent of PGMEA and EL in a mixing ratio of 6:4 (mass ratio) to obtain a positive resist composition solution.

Then, the resulting positive resist composition solution was uniformly coated on a 8 inch silicone substrate subjected to a hexamethyldisilazane treatment using a spinner, followed by subjecting to a PAB treatment at 110° C. for 90 seconds of PAB condition to form a resist film (thickness: 80 nm).

Using an EUV exposure apparatus HiNA3 (exposure apparatus possessed by Association of Super-Advanced Electronics Technologies (ASET)), the resist film was exposed, subjected to a PEB treatment at 100° C. for 90 seconds of PEB condition and then developed with a developing solution NMD-3 containing an aqueous 2.38 mass % solution of TMAH (product name, manufactured by Tokyo Ohka Kogyo Co., Ltd.) (23° C.) for 30 seconds and then rinsed with pure water for 30 seconds rinsing to form a L/S pattern.

The resulting resist pattern was evaluated in the same manner as described above. As a result, it was confirmed line-and-space of 45 nm was resolved and sensitivity is 13 A·sec (ampere sec). Also, resist pattern shape was good.

Example 6

In the same manner as described above, except that the same positive resist composition as that of Example 5 was used and the developing solution containing an aqueous 2.38 mass % solution of TMAH was replaced by NMD-W (product name, manufactured by Tokyo Ohka Kogyo Co., Ltd.), a resist pattern was formed.

The resulting resist pattern was evaluated in the same manner as described above. As a result, resolution of line-and-space of 45 nm was confirmed and sensitivity was 13 A·sec (ampere sec). Also, resist pattern shape was good.

INDUSTRIAL APPLICABILITY

The present invention can be applied to a resist composition, a resist pattern forming method using the resist composition, a compound suited for the resist composition.

The invention claimed is:

1. A resist composition comprising a base material component (A) having an acid dissociable dissolution inhibiting group in which alkali solubility enhances under an action of an acid, and an acid generator component (B) which generates an acid upon exposure, wherein the base material component (A) contains a compound (A1) in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the following general formulas (p1) and (p2):

[Chemical Formula 1]

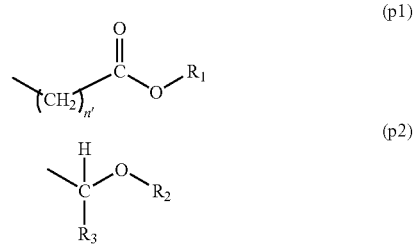

wherein $R_1$ and $R_2$ each independently represents a branched or cyclic alkyl group, and may contain a hetero atom in the structure; $R_3$ represents a hydrogen atom or a lower alkyl group; and n' represents an integer of 1 to 3, wherein the proportion of the compound (A1) within the component (A) is within a range from greater than 80 wt % to 100 wt %.

2. The resist composition according to claim 1, wherein the polyhydric phenol compound (a) is at least one selected from the group consisting of compounds represented by the following general formulas (I), (II) and (III):

[Chemical Formula 2]

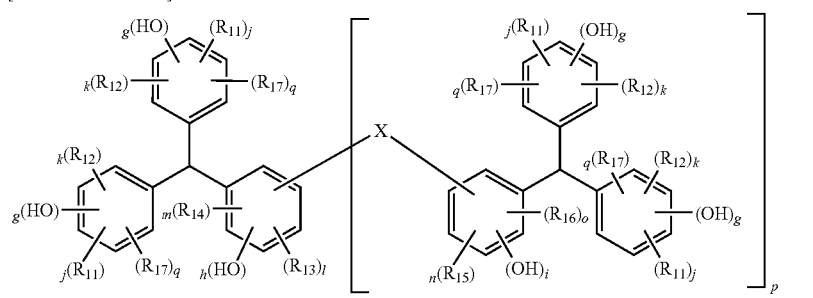

in the formula (I), $R_{11}$ to $R_{17}$ each independently represents an alkyl group having 1 to 10 carbon atoms or an aromatic hydrocarbon group, and may contain a hetero atom in the structure; g and j each independently represents an integer of 1 or more; k and q represents an integer of 0 or 1 or more, and g+j+k+q is 5 or less; h represents an integer of 1 or more, l and m each independently represents an integer of 0 or 1 or more, and h+l+m is 4 or less; i represents an integer of 1 or more, n and o each independently represents an integer of 0 or 1 or more, and i+n+o is 4 or less; p is 0 or 1; and X represents a group represented by the following general formula (Ia) or (Ib):

[Chemical Formula 3]

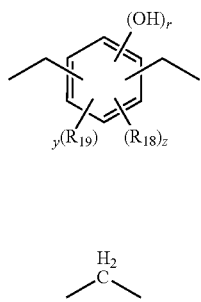

(Ia)

(Ib)

(in the formula (Ia), $R_{18}$ and $R_{19}$ each independently represents an alkyl group having 1 to 10 carbon atoms or an aromatic hydrocarbon group, and may contain a hetero atom in the structure; r, y and z each independently represents an integer of 0 or 1 or more, and r+y+z is 4 or less);

[Chemical Formula 4]

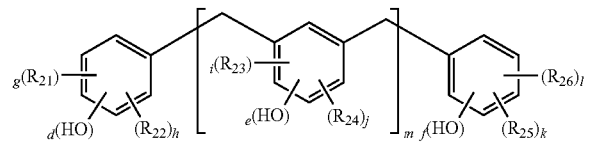

(II)

in the formula (II), $R_{21}$ to $R_{26}$ each independently represents an alkyl group having 1 to 10 carbon atoms or an aromatic hydrocarbon group, and may contain a hetero atom in the structure; d and g each independently represents an integer of 1 or more, h represents an integer of 0 or 1 or more, and d+g+h is 5 or less; e represents an integer of 1 or more, i and j each independently represents an integer of 0 or 1 or more, and e+i+j is 4 or less; f and k each independently represents an integer of 1 or more, l represents an integer of 0 or 1 or more, and f+k+l is 5 or less; and m represents an integer of 1 to 20; and

[Chemical Formula 5]

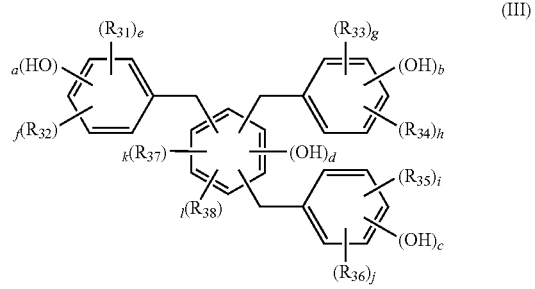

(III)

in the formula (III), $R_{31}$ to $R_{38}$ each independently represents an alkyl group having 1 to 10 carbon atoms or an aromatic hydrocarbon group, and may contain a hetero atom in the structure; a and e each independently represents an integer of 1 or more, f represents an integer of 0 or 1 or more, and a+e+f is 5 or less; b and h each independently represents an integer of 1 or more, g represents an integer of 0 or 1 or more, and b+h+g is 5 or less; c and i each independently represents an integer of 1 or more, j represents an integer of 0 or 1 or more, and c+i+j is 5 or less; d represents an integer of 1 or more, k and l each independently represents an integer of 0 or 1 or more, and d+k+l is 3 or less.

3. The resist composition according to claim 1 or 2, further comprising a nitrogen-containing organic compound (D).

4. A resist pattern forming method, which comprises the steps of forming a resist film on a substrate using the resist composition of claim 1 or 2, exposing the resist film, and developing the resist film to form a resist pattern.

5. A compound in which a portion or all of hydrogen atoms of phenolic hydroxyl groups in a polyhydric phenol compound (a) having two or more phenolic hydroxyl groups and having a molecular weight of 300 to 2,500 are substituted with at least one selected from the group consisting of acid dissociable dissolution inhibiting groups represented by the following general formulas (p1) and (p2):

[Chemical Formula 6]

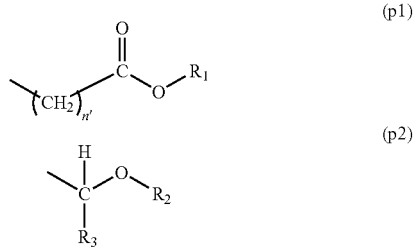

(p1)

(p2)

wherein $R_1$ and $R_2$ each independently represents a branched or cyclic alkyl group, and may contain a hetero atom in the structure; $R_3$ represents a hydrogen atom or a lower alkyl group; and n' represents an integer of 1 to 3, wherein the polyhydric phenol compound (a) is at least one selected from the group consisting of compounds represented by the following general formula (I):

[Chemical Formula 7]

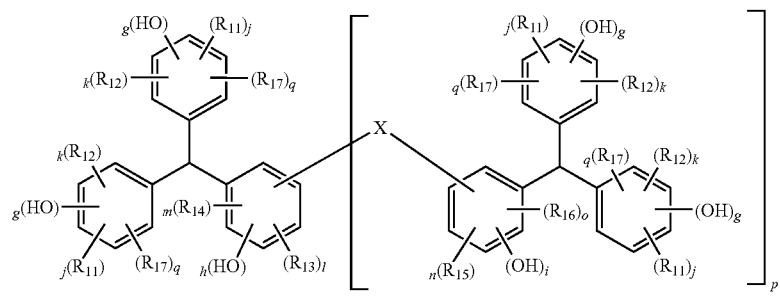 (I)

in the formula (I), $R_{11}$ to $R_{17}$ each independently represents an alkyl group having 1 to 10 carbon atoms or an aromatic hydrocarbon group, and may contain a hetero atom in the structure; g and j each independently represents an integer of 1 or more, k and q represent an integer of 0 or 1 or more, and g+j+k+q is 5 or less; h represents an integer of 1 or more, l and m each independently represents an integer of 0 or 1 or more, and h+l+m is 4 or less; i represents an integer of 1 or more, n and o each independently represents an integer of 0 or 1 or more, and i+n+o is 4 or less; p is 1; and X represents a group represented by the following general formula (Ia) or (Ib):

[Chemical Formula 8]

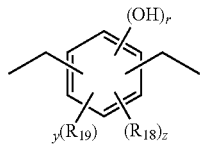 (Ia)

-continued

 (Ib)

(in the formula (Ia), $R_{18}$ and $R_{19}$ each independently represents an alkyl group having 1 to 10 carbon atoms or an aromatic hydrocarbon group, and may contain a hetero atom in the structure; r, y and z each independently represents an integer of 0 or 1 or more, and r+y+z is 4 or less).

* * * * *

UNITED STATES PATENT AND TRADEMARK OFFICE
CERTIFICATE OF CORRECTION

| | | |
|---|---|---|
| PATENT NO. | : 7,851,129 B2 | Page 1 of 1 |
| APPLICATION NO. | : 11/718091 | |
| DATED | : December 14, 2010 | |
| INVENTOR(S) | : Shiono et al. | |

It is certified that error appears in the above-identified patent and that said Letters Patent is hereby corrected as shown below:

Column 9, Line 54, change "carbon" to --5 carbon--.

Column 13, Line 3, change "carbon" to --5 carbon--.

Column 14, Line 17, change "unrequited" to --unrequired--.

Column 17, Line 31, change "generators" to --generators.--.

Column 23, Line 51, change "(A)" to --(A),--.

Column 24, Line 34, change "(D)" to --(D),--.

Column 25, Line 53, change "(TMAH)" to --(TMAH),--.

Column 26, Line 36, change "(dissolution contrast)" to --(dissolution contrast),--.

Column 32, Line 3, change ")(" to --)-(--.

Column 32, Line 8 (Approx.), change "that" to --than--.

Column 32, Line 44, change "that" to --than--.

Column 33, Lines 5-6, change "calorimeter)" to --calorimeter),--.

Column 33, Line 14, change "2" to --2.--.

Column 36, Line 20, change "(9')" to --(9'),--.

Signed and Sealed this
Fifth Day of July, 2011

David J. Kappos
*Director of the United States Patent and Trademark Office*